(12) United States Patent
Malozemoff et al.

(10) Patent No.: US 7,674,751 B2
(45) Date of Patent: Mar. 9, 2010

(54) FABRICATION OF SEALED HIGH TEMPERATURE SUPERCONDUCTOR WIRES

(75) Inventors: Alexis P. Malozemoff, Lexington, MA (US); Martin W. Rupich, Framingham, MA (US); Douglas C. Folts, Baraboo, WI (US)

(73) Assignee: American Superconductor Corporation, Westborough, MA (US)

( * ) Notice: Subject to any disclaimer, the term of this patent is extended or adjusted under 35 U.S.C. 154(b) by 794 days.

(21) Appl. No.: 11/490,779

(22) Filed: Jul. 21, 2006

(65) Prior Publication Data

US 2007/0179063 A1    Aug. 2, 2007

Related U.S. Application Data

(60) Provisional application No. 60/757,855, filed on Jan. 10, 2006.

(51) Int. Cl.
*H01L 39/24* (2006.01)
*H01B 12/00* (2006.01)
*H01L 39/00* (2006.01)

(52) U.S. Cl. .............. 505/430; 505/431; 505/471; 505/230; 505/231; 505/236; 505/728; 505/930; 174/125.1; 29/599; 427/62

(58) Field of Classification Search ......... 505/230–232, 505/236–239, 440, 926; 29/599; 174/125.1
See application file for complete search history.

(56) References Cited

U.S. PATENT DOCUMENTS

| | | | |
|---|---|---|---|
| 5,231,074 A | 7/1993 | Cima et al. | |
| 5,321,003 A * | 6/1994 | Joshi et al. | 505/220 |
| 6,022,832 A | 2/2000 | Fritzemeier et al. | |
| 6,027,564 A | 2/2000 | Fritzemeier et al. | |
| 6,190,752 B1 | 2/2001 | Do et al. | |
| 6,436,317 B1 | 8/2002 | Malozemoff et al. | |
| 6,444,917 B1 | 9/2002 | Scudiere et al. | |
| 6,537,689 B2 | 3/2003 | Schoop et al. | |
| 6,745,059 B2 | 6/2004 | Buczek et al. | |
| 6,797,313 B2 | 9/2004 | Fritzemeier et al. | |

(Continued)

FOREIGN PATENT DOCUMENTS

JP     2003-206134     7/2003

(Continued)

OTHER PUBLICATIONS

U.S. Appl. No. 09/007,372.

(Continued)

*Primary Examiner*—Stanley Silverman
*Assistant Examiner*—Kallambella Vijayakumar
(74) *Attorney, Agent, or Firm*—Wilmer Cutler Pickering Hale & Dorr LLP

(57) ABSTRACT

A method of making a laminated superconductor wire includes providing an assembly, where the assembly includes a substrate; a superconductor layer overlaying a surface of the substrate, the superconductor layer having a defined pattern; and a cap layer; and slitting the assembly in accordance with the defined pattern of the superconductor layer to form a sealed wire. Slitting the assembly in accordance with the defined pattern may form multiple sealed wires, and the substrate may be substantially wider than the sealed wires.

21 Claims, 12 Drawing Sheets

U.S. PATENT DOCUMENTS

| | | | |
|---|---|---|---|
| 6,828,507 B1 * | 12/2004 | Fritzemeier et al. | 174/125.1 |
| 6,887,332 B1 * | 5/2005 | Kagan et al. | 427/97.3 |
| 6,974,501 B1 | 12/2005 | Zhang et al. | |
| 2006/0040829 A1 | 2/2006 | Rupich et al. | |
| 2006/0040830 A1 * | 2/2006 | Thieme et al. | 505/231 |
| 2006/0073975 A1 | 4/2006 | Thieme et al. | |
| 2006/0073979 A1 | 4/2006 | Thieme et al. | |
| 2006/0094603 A1 | 5/2006 | Li et al. | |
| 2007/0111893 A1 | 5/2007 | Kodenkandath et al. | |
| 2007/0145100 A1 | 6/2007 | Suzuki et al. | |

FOREIGN PATENT DOCUMENTS

| | | |
|---|---|---|
| WO | WO-98/58415 | 12/1998 |
| WO | WO-99/16941 | 4/1999 |
| WO | WO-99/17307 | 4/1999 |
| WO | WO-00/58044 | 10/2000 |
| WO | WO-00/58530 | 10/2000 |
| WO | WO-01/08169 | 2/2001 |
| WO | WO-01/08170 | 2/2001 |
| WO | WO-01/08231 | 2/2001 |
| WO | WO-01/08232 | 2/2001 |
| WO | WO-01/08233 | 2/2001 |
| WO | WO-01/08235 | 2/2001 |
| WO | WO-01/08236 | 2/2001 |
| WO | WO-01/11428 | 2/2001 |
| WO | WO-01/15245 | 3/2001 |
| WO | WO-01/26164 | 4/2001 |
| WO | WO-01/26165 | 4/2001 |
| WO | WO-02/35615 | 5/2002 |
| WO | WO-2005/081710 | 9/2005 |
| WO | WO-2005/121414 | 12/2005 |

OTHER PUBLICATIONS

U.S. Appl. No. 09/500,701.

U.S. Appl. No. 09/615,669.

U.S. Appl. No. 60/166,297, filed Nov. 18, 1999, Fritzemeier.

U.S. Appl. No. 60/308,957, filed Jul. 31, 2001, Fritzemeier.

U.S. Appl. No. 60/309,116, filed Jul. 31, 2001, Fritzemeier et al.

U.S. Appl. No. 60/667,001, filed Mar. 31, 2005, Thieme.

U.S. Appl. No. 60/703,815, filed Jul. 29, 2005, Kodenkandath.

U.S. Appl. No. 60/757,855, filed Jan. 10, 2006, Kodenkandath.

Beach, D. et al., "Sol-Gel Synthesis of Rare Earth Aluminate Films as Buffer Layers for High Tc Superconducting Films", *Mat. Res. Soc. Symp. Proc.*, vol. 495, pp. 263-270, 1988.

Glowacki, B.A., "Preparation of $Bi_2Sr_2CaCu_2O_{8-x}$ tracks and thick films by jet printing," *Supercond. Sci. Technol.*, vol. 13 (2000) pp. 584-591.

http://www.microfab.com/technology/energy/energy.html, printed on Feb. 5, 2008.

Lee, D.J. et al., "Alternative Buffer Architectures for High Critical Current Density YBCO Superconducting Deposits on Rolling Assisted Biaxially-Textured Substrates", *Japanese J. Appl. Phys.*, vol. 38, L178-L180, Feb. 15, 1999.

Paranthaman, M. et al., "Growth of biaxially textured RE203 buffer layers on rolled-Ni substrates using reactive evaporation for HTS-coated conductors", *Superconductor Sci. Tech.*, vol. 12, pp. 319-325, 1999.

Rupich, M.W. et al., "Growth and Characterization of Oxide Buffer Layers for YBCO Coated Conductors", *I.E.E.E. Trans. On Appl. Supercon.*, vol. 9, No. 2, pp. 1527-1530, Jun. 1999.

Schuster, T. et al., "High-precision laser cutting of high-temperature superconductors," *Appl. Phys. Lett*, vol. 68, No. 18, Apr. 29, 1996, pp. 2568-2570.

Shoup et al, Epitaxial Thin Film Growth of Lanthanum and Neodymium Aluminate Films on Roll-Textured Nickel Using a Sol-Gel Method, *J. Am. Cer. Soc.*, vol. 81, pp. 3019-3021, 1988.

Tabei, H., et al., "Laser cutting of superconductive plate," *Physica C*, vol. 235-240 (1994) pp. 3431-3432.

\* cited by examiner

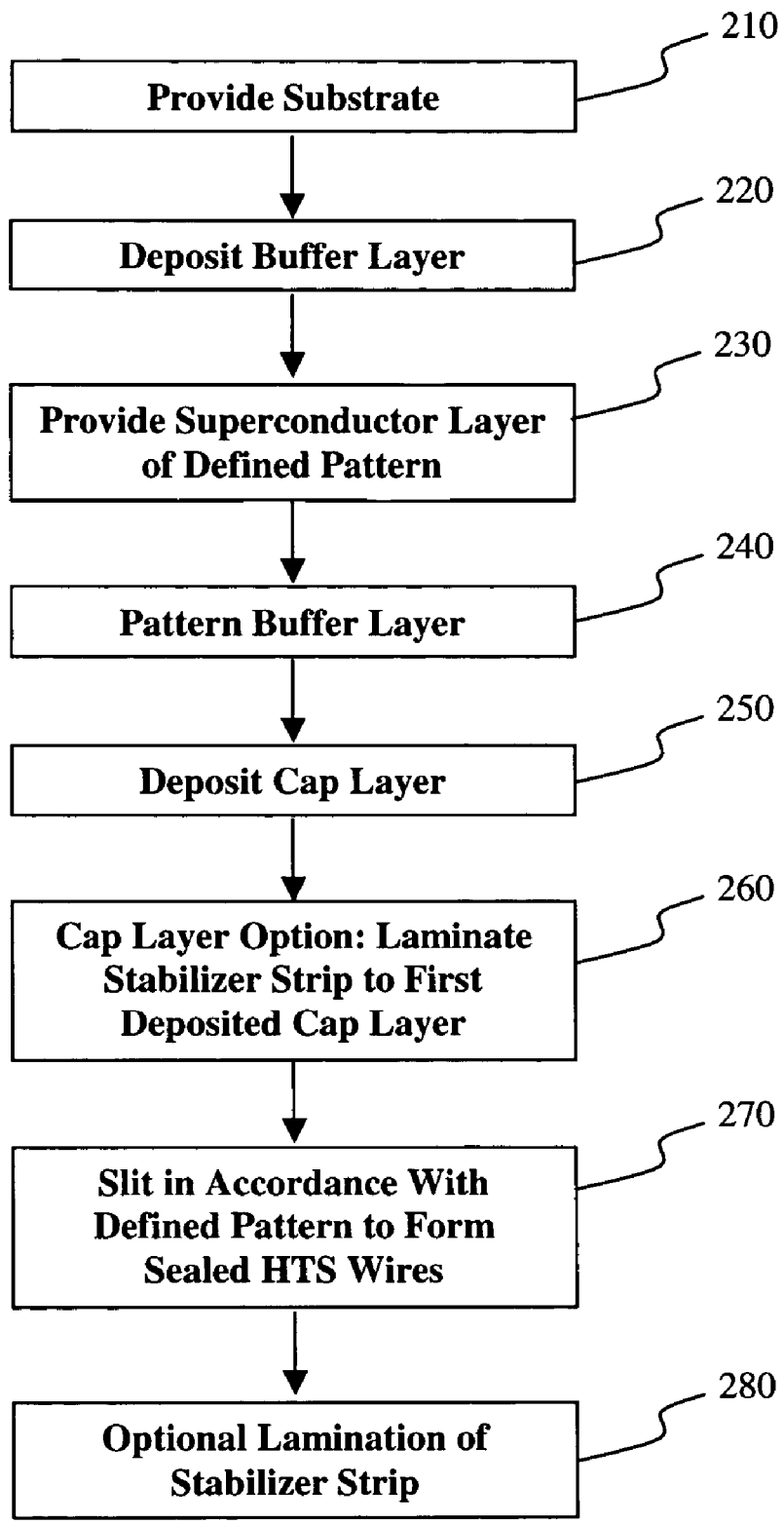

FABRICATION OF SEALED HIGH TEMPERATURE SUPERCONDUCTOR WIRES

RELATED APPLICATIONS

This application claims the benefit under 35 U.S.C. §19(e) of the following application, the entire contents of which are incorporated herein by reference:

U.S. Provisional Application Ser. No. 60/757,855, filed on Jan. 10, 2006 and entitled "Method of Patterning Oxide Superconducting Films."

This application is related to the following application, the entire contents of which are incorporated herein by reference:

U.S. patent application Ser. No. 10/955,866, filed on Sep. 29, 2004 and entitled "Dropwise Deposition of a Patterned Oxide Superconductor."

TECHNICAL FIELD

This invention relates to the field of manufacturing high temperature superconductors.

BACKGROUND

High temperature superconductor (HTS) materials provide a means for carrying extremely large amounts of current with extremely low loss. HTS materials lose all resistance to the flow of direct electrical current and nearly all resistance to the flow of alternating current when cooled below a critical temperature. The development of HTS wires (the expression "wires" is used here for a variety of conductors, including tape-like conductors) using these materials promises a new generation of high efficiency, compact, and environmentally friendly electrical equipment, which has the potential to revolutionize electric power grids, transportation, materials processing, and other industries. However, a commercially viable product has stringent engineering requirements, which has complicated the implementation of the technology in commercial applications.

In the second generation HTS wire (coated conductor) technology, currently under development, the HTS material is generally a polycrystalline rare-earth/alkaline-earth/copper oxide, e.g. yttrium-barium-copper oxide (YBCO). The current carrying capability of the HTS material is strongly related to its crystalline alignment or texture. Grain boundaries formed by the misalignment of neighboring crystalline superconductor grains are known to form an obstacle to superconducting current flow, but this obstacle decreases with the increasing degree of alignment or texture. Therefore to make the material into a commercially viable product, e.g. an HTS wire, the superconducting material must maintain a high degree of crystalline alignment or texture over relatively long distances. Otherwise, the superconducting current carrying capacity (critical current density) will be limited.

A schematic of a typical second-generation HTS wire 100 is shown in FIG. 1. The wire includes substrate 110, buffer layer 120 (which could include multiple buffer layers), superconductor layer 130, and cap layer 140, and is fabricated as described below. It should be noted that in this and all subsequent figures, the dimensions are not to scale. Superconductor materials can be fabricated with a high degree of crystallographic alignment or texture over large areas by growing a thin layer 130 of the material epitaxially on top of a flexible tape-shaped substrate 110 and buffer layer 120, which are fabricated so that the surface of the topmost layer has a high degree of crystallographic texture at its surface. When the crystalline superconductor material is grown epitaxially on this surface, its crystal alignment grows to match the texture of the substrate. In other words, the substrate texture provides a template for the epitaxial growth of the crystalline superconductor material. Further, the substrate provides structural integrity to the superconductor layer.

Substrate 110 and/or buffer 120 can be textured to provide a template that yields an epitaxial superconductor layer 130 with excellent superconducting properties such as high critical current density. Materials such as nickel, copper, silver, iron, silver alloys, nickel alloys, iron alloys, stainless steel alloys, and copper alloys can be used, among others, in the substrate. Substrate 110 can be textured using a deformation process, such as one involving rolling and recrystallization annealing the substrate. An example of such a process is the rolling-assisted biaxially textured substrate (RABiTS) process. In this case large quantities of metal can be processed economically by deformation processing and annealing and can achieve a high degree of texture.

One or more buffer layers 120 can be deposited or grown on the surface of substrate 110 with suitable crystallographic template on which to grow the superconductor layer 130. Buffer layers 120 also can provide the additional benefit of preventing diffusion over time of atoms from the substrate 110 into the crystalline lattice of the superconductor material 130 or of oxygen into the substrate material. This diffusion, or "poisoning," can disrupt the crystalline alignment and thereby degrade the electrical properties of the superconductor material. Buffer layers 120 also can provide enhanced adhesion between the substrate 110 and the superconductor layer 130. Moreover, the buffer layer(s) 120 can have a coefficient of thermal expansion that is well matched to that of the superconductor material. For implementation of the technology in commercial applications, where the wire may be subjected to stress, this feature is desirable because it can help prevent delamination of the superconductor layer from the substrate.

Alternatively, a non-textured substrate 110 such as Hastelloy can be used, and textured buffer layer 120 deposited by means such as the ion-beam-assisted deposition (IBAD) or inclined substrate deposition (ISD). Additional buffer layers 120 may be optionally deposited epitaxially on the IBAD or ISD layer to provide the final template for epitaxial deposition of an HTS layer 130.

By using a suitable combination of a substrate 110 and one or more buffer layers 120 as a template, superconductor layer 130 can be grown epitaxially with excellent crystal alignment or texture, also having good adhesion to the template surface, and with a sufficient barrier to poisoning by atoms from the substrate. The superconductor layer 130 can be deposited by any of a variety of methods, including the metal-organic deposition (MOD) process, metal-organic chemical vapor deposition (MOCVD), pulsed laser deposition (PLD), thermal or e-beam evaporation, or other appropriate methods. Lastly, a cap layer 140 can be added to the multilayer assembly, which helps prevent contamination of the superconductor layer from above. The cap layer 140 can be, e.g., silver or a silver-gold alloy, and can be deposited onto the superconductor layer 130 by, e.g., sputtering. In the case where slitting is performed after lamination, the cap layer may also include an additional laminated metal "stabilizer" layer, such as a copper or stainless steel layer, bonded to the cap layer, e.g., by soldering.

An exemplary as-fabricated multilayer HTS wire 100 includes a biaxially textured substrate 110 of nickel with 5% tungsten alloy; sequentially deposited epitaxial buffer layers 120 of $Y_2O_3$, YSZ, and $CeO_2$; epitaxial layer 130 of YBCO; and a cap layer 140 of Ag. Exemplary thicknesses of these layers are: a substrate of about 25-75 microns, buffer layers of about 75 nm each, a YBCO layer of about 1 micron, and a cap layer of about 1-3 microns. HTS wires 100 as long as 100 m have been manufactured thus far using techniques such as those described above.

HTS wires with relatively large widths, such as 4 cm, 10 cm, or more, can be produced by this method. The wires can then be slit along their length into numerous smaller wires (e.g., 25 strips of 0.4 cm wires). This can reduce manufacturing costs, because a particular step, such as the fabrication of a superconductor layer, will need to be performed only once to produce multiple wires. However, the slitting process can damage one or more of the relatively brittle oxide layers, i.e., the buffer and/or superconductor layers, within the wire. Slitting can cause cracks in the oxide layer, which have some probability of spreading into the wire and causing a defect. Additionally, mechanical slitting machines can wear out with time and use, requiring maintenance such as the periodic replacement of blades. This wear and replacement introduces variables into the manufacturing process, and requires development of new inspections and metrics in order to ensure the consistency and quality of the resulting wires.

One issue for coated conductor HTS wires is that of environmental contamination when the wire is in use. Environmental exposure can slowly degrade the electrical performance of superconductor layers. Also, in the presence of cryogenic liquids such as liquid nitrogen in contact with the wire, the liquid can diffuse into pores within the wire, and on warming can form "balloons" that can damage the wire. Sealing the wire is desirable to prevent either environmental exposure of the HTS layers or penetration of the liquid cryogen into the wire. Seals for HTS assemblies are described in, e.g. U.S. Pat. No. 6,444,917.

During use, it is desirable that the HTS wire is able to tolerate bend strains. A bend induces tensile strain on the convex outer surface of the bend, and compressive strain on the concave inner surface of the bend, thereby subjecting the HTS layer to tensile or compressive strains depending on the direction in which the wire is bent. While a modest amount of compressive stress can actually enhance the current carrying capacity of a superconductor layer, in general subjecting the whole assembly to stress (especially repeated stress) places the wire at risk of mechanical damage. For example, cracks could form and propagate in the superconductor layer, degrading its mechanical and electrical properties, or the different layers could delaminate from each other or from the substrate. Methods for reducing stress in the superconductor layer are described, e.g., in U.S. Pat. No. 6,745,059 and U.S. Pat. No. 6,828,507. For example, a copper strip, chosen to have similar thickness and mechanical features to the substrate, can be bonded onto the upper surface of the insert. This sandwiches the superconductor layer roughly in the middle of the overall structure, so if the assembly is bent, the superconductor layer is neither at the outer nor inner surface of the bend.

SUMMARY

A method of manufacture of sealed high temperature superconductor (HTS) wires includes providing a superconductor assembly, which includes a substrate, one or more buffer layers, and a superconductor layer of defined pattern overlaying the substrate and the buffer layers. The superconductor layer may be patterned to form multiple filaments, or lines, on the substrate, which are separated by gaps. A protective cap layer is deposited over the patterned superconductor and substrate, coats the superconductor, and bonds to the substrate where they contact each other within the gaps. A stabilizer strip is optionally laminated to the cap layer. Then, the resulting assembly is slit along the gaps to create multiple HTS wires. Because the gap does not contain any superconducting material, the slitting process does not crack or otherwise damage the brittle superconductor material. This can improve the performance and longevity of the wire as compared with wires manufactured by slitting the HTS layer directly.

The cap layer and the substrate bond together in the gap, which allows the wire to be sealed as it is slit. The superconductor assembly can be slit with a laser beam, a mechanical slitting device, or another appropriate method. Laser beams offer a particularly "clean" method of slitting HTS assemblies, because they do not use moving parts and thus may avoid some of the complications of mechanical slitting devices, such as mechanical wear. As described below, heat from the laser can fuse or weld the metal layer to the substrate, sealing the wire particularly well to the environment. This can further improve the speed, efficiency, and cost of producing HTS wires, as well as the quality of the wires.

Under one aspect, a method of making a laminated superconductor wire includes providing an assembly, which includes a substrate; a superconductor layer overlaying a surface of the substrate, the superconductor layer having a defined pattern; and a cap layer. The method includes slitting the assembly in accordance with the defined pattern of the superconductor layer to form a sealed wire.

In one embodiment, slitting the assembly in accordance with the defined pattern forms multiple sealed wires. The substrate may be substantially wider than the sealed wires.

In another embodiment, the defined pattern of the superconductor layer comprises multiple filaments separated by multiple gaps along the length of the substrate. Each of the multiple filaments may have a width between about 0.1 mm and 8 mm. Each of the multiple gaps may have a width between about 0.1 and 2 mm.

In another embodiment, slitting the assembly does not include slitting the superconductor layer.

In another embodiment, the cap layer contacts the substrate in accordance with the defined pattern of the superconductor layer. The sealing of the wire may derive from bonding between the cap layer and the substrate. Slitting the assembly may enhance bonding between the cap layer and the substrate.

Providing the assembly may include one or more of the following. Using ink-jet printing to provide the superconductor layer in accordance with the defined pattern. Using patterned slot-die coating to provide the superconductor layer in accordance with the defined pattern. Using photolithographic patterning to provide the superconductor layer in accordance with the defined pattern. Depositing a superconductor precursor, patterning the precursor using laser ablation in accordance with the defined pattern, and converting the precursor to the superconductor layer. Depositing a superconductor precursor, patterning the precursor using scribing in accordance with the defined pattern, and converting the precursor to the superconductor layer.

In another embodiment, the assembly also includes a buffer layer between the substrate and the superconductor layer. Providing the assembly may include patterning the buffer layer in accordance with the defined pattern of the superconductor layer. The buffer layer may be patterned after providing the superconductor layer, or before providing the superconductor layer.

Slitting the assembly may include mechanically cutting the assembly. Slitting the assembly may include irradiating the assembly with at least one laser beam. Irradiating the assembly with at least one laser beam may additionally weld the cap layer to the substrate.

The expression "superconductor filament" is intended to indicate a long, patterned strip of superconducting material, which overlays a substrate and one or more buffer layers. The buffer layer may also be patterned.

The expression "HTS wire" is intended to indicate a multilayer structure for use in carrying current, which is substantially sealed to the environment. An HTS wire typically includes a substrate, one or more buffer layers, a superconductor filament, a cap layer, and optionally a stabilizer layer that can be considered part of the cap layer. Generally in this HTS wire, the superconductor layer can be electrically isolated from the metallic substrate by the buffer layer(s). However, if electrically conductive buffer layers are used, the superconductor layer can be electrically connected to the metal substrate. Alternatively, an electrically conductive cap layer can be in contact with both the superconductor layer and the substrate, and provide electrical contact between the two.

The expression "superconductor assembly" is intended to indicate an intermediate structure that includes a substrate, one or more buffer layers that may be patterned, multiple superconductor filaments, a cap layer, and optionally a stabilizer strip. The superconductor assembly is slit to form multiple HTS wires.

The expression "sealed" is intended to mean substantially surrounded and substantially physically isolated from the environment. The expression "sealed" may include, but is not required to include, substantial impermeability to penetration from gas or liquid under normal circumstances.

BRIEF DESCRIPTION OF THE DRAWINGS

The invention is described with reference to the following figures, which are presented for the purpose of illustration only and which are not intended to be limiting of the invention.

FIG. 2 is a flow chart of steps in the fabrication of HTS wires according to one or more embodiments of the invention.

DETAILED DESCRIPTION

Overview

Figure 1:
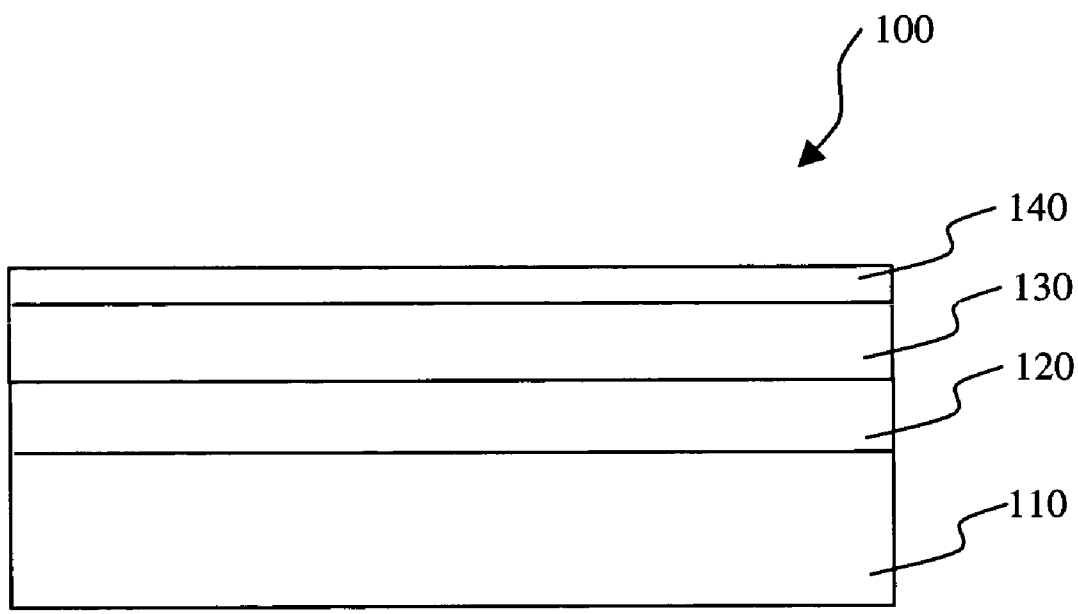
FIG. 1 is a cross-sectional view of a typical HTS wire.

High temperature superconducting wires can be manufactured by patterning superconductor layers, and optionally also the underlying buffer layers, on a metallic tape. This allows multiple wires to be manufactured without directly slitting, and therefore potentially damaging, the brittle superconductor and buffer layers within the wires. The superconductor, and optionally the underlying buffer layer, is patterned on the substrate to form multiple filaments or lines along the length of the substrate. The filaments can be separated by "gaps" which are bare of the brittle oxide layers. A cap layer is then deposited over the filaments, and bonds to the substrate and/or buffer exposed in the gaps. A stabilizer strip is optionally laminated to the cap layer. Then the resulting assembly is slit along the gaps between the superconductor filaments, forming multiple wires. These wires are each sealed from the environment by the bond between the cap layer and the substrate or buffer-covered template, without the need to perform a separate sealing step on each wire. The seal may be further enhanced by the method by which the wires were slit. A stabilizer strip may be optionally laminated to the individual wires after slitting. By laminating the entire web before slitting, each wire is stabilized and sealed. Thus, patterning superconductors, and optionally buffer layers, reduces the number of steps for manufacturing HTS wires and reduces the risk of damaging the brittle HTS and buffer layers in those wires, thus facilitating the efficient and cost-effective fabrication of high-quality sealed, stabilized HTS wires.

FIG. 2 is a flow chart summarizing steps in the fabrication of HTS wires according to certain embodiments. First, a substrate is provided (210). Next, a buffer layer is provided (220). Next, a superconductor layer of defined pattern is formed (230). Then, optionally the buffer layer is patterned (240). Next, a cap layer is deposited over the patterned superconductor and buffer layers (250). Wherever the cap layer contacts the substrate or buffer, they bond together. Next, optionally a stabilizer strip is laminated to the cap layer, using a filler such as solder (260). Next, the assembly is slit in accordance with the defined pattern of the superconductor and buffer layers (270). This forms multiple HTS wires that are each sealed to the environment, and optionally include a stabilizer strip for additional thermal, mechanical, and electrical stability. The stabilizer strip can optionally be laminated to the wires after slitting (280).

Figure 3A:
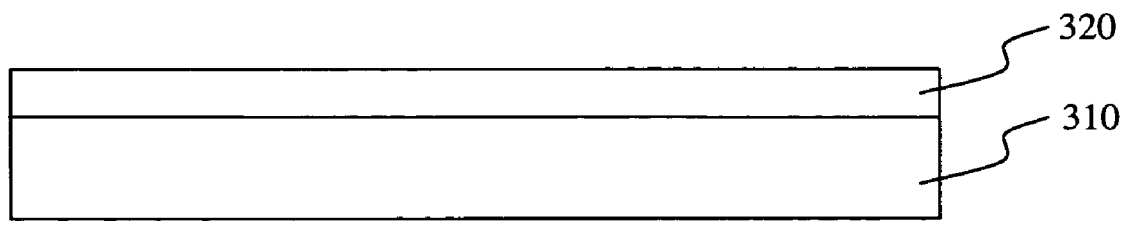
FIGS. 3A-3F are cross-sectional views of structures formed during the manufacture of HTS wires according to one or more embodiments of the invention.

FIGS. 3A-3F are cross-sectional illustrations of structures formed during the fabrication of sealed, stabilized HTS wires according to certain embodiments. Details of the process steps forming each structure are described in greater detail below. First, as shown in FIG. 3A, a substrate 310 is provided. As described in greater detail below, the substrate can be a metal such as nickel, copper, silver, copper, zinc, aluminum, chromium, vanadium, palladium, molybdenum, and/or their alloys, e.g., nickel-tungsten. In one embodiment, a surface of substrate 310 is biaxially textured to provide a crystal template for buffer layer(s) 320 and superconductor layer 330. One or more buffer layer(s) 320 are deposited on substrate 310. In one or more embodiments, the buffer layer is an electrically insulating material, although electrically conductive materials can also be used. The buffer layer is made up of, e.g., an inert metal, an oxide, zirconate, titanate, niobate, nitride, tantalate, aluminate, cuprate, manganate, or ruthenate of a metal or rare earth element (e.g. $Al_2O_3$, $CeO_2$, $Y_2O_3$, MgO, $Gd_2O_3$, strontium titanate, gadolinium zirconate, yttria-stabilized zirconia, AlN, $Si_3N_4$, $LaMnO_4$, $La_2Zr_2O_7$, or $La_{2-x}Ce_xZr_2O_7$. Any material, or combination of materials, that provides a suitable texture on which to grow a superconductor crystal can be used. Optionally, the buffer layers can be patterned into filaments.

Figure 3B:
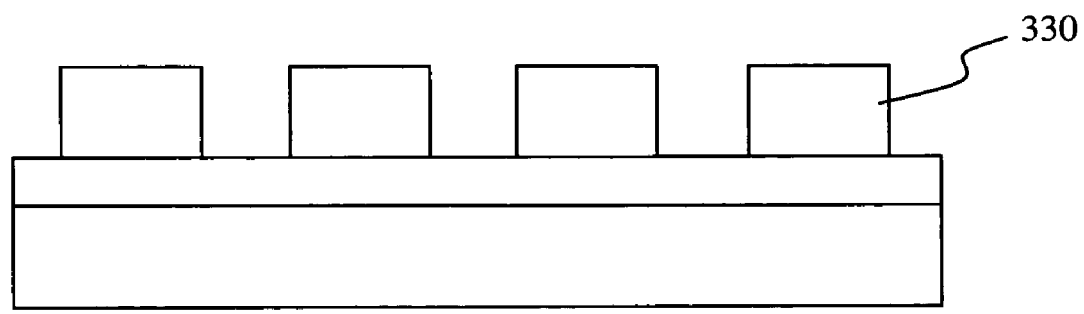

Next, as shown in FIG. 3B, superconductor layer 330 is deposited on buffer layer(s) 320. In one or more embodiments, superconductor layer 330 includes a rare earth-alkaline earth-copper oxide, such as YBCO, although in general any high temperature superconductor can be used. Superconductor layer 330 is optionally formed by depositing a superconductor precursor on buffer layer(s) 320, converting that precursor to an intermediate, and then converting the intermediate to the superconductor layer 330, as described in greater detail below. Alternately, superconductor layer 330 is formed in situ by a deposition technique such as laser ablation, MOCVD, etc.

As shown in FIG. 3B, superconductor layer 330 is patterned to form multiple filaments along the length of substrate 310. As described in greater detail below, the film can be patterned while depositing the superconductor precursor, e.g., by "printing" patterned filaments of the precursor onto buffer layer(s) 320, and then converting the patterned precursor to superconductor layer 330. The patterning also can be done after depositing the superconductor precursor over the width of the substrate. The precursor can be patterned, e.g., with scribing, and then converted to the superconductor; or the superconductor layer itself can be patterned, e.g., with photolithography. These and other methods of patterning superconductor layer 330, according to certain embodiments, are described in greater detail below.

Figure 3C:
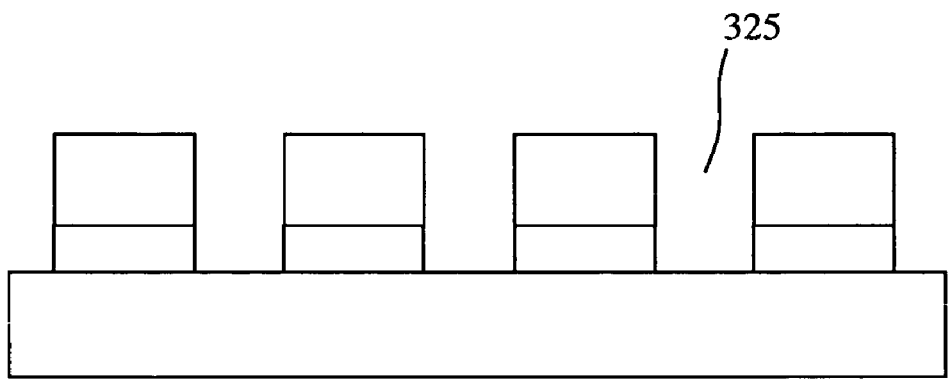

Next, as shown in FIG. 3C, buffer layer 330 is optionally patterned to form gaps 325 e.g., using laser ablation. In general, buffer layer 320 can be patterned before, during, or after the deposition and/or patterning of superconductor layer 330, as described in greater detail below.

Figure 3D:
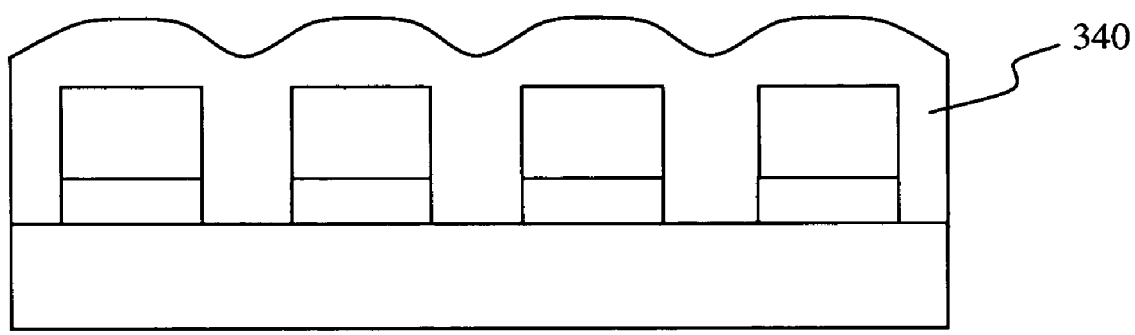

Next, as shown in FIG. 3D, the patterned superconductor/buffer filaments are coated with cap layer 340, which substantially fills gaps 325 in assembly 310, 320, 330 and substantially conforms to the patterned filaments without leaving spaces. Cap layer 340 may be Ag, or other material that is inert to superconductor layer 330, such as a noble metal. Further details may be found in commonly owned U.S. Provisional Patent Application No. 60/703,815, entitled "High Temperature Superconducting Wires and Coils," filed on Jul. 29, 2005, which is hereby incorporated in its entirety by reference. Cap layer 340 bonds to substrate 310 within gaps 325. In one or more embodiments, cap layer 340 and substrate 310 are made of the same material, which allows them to form a secure bond to each other. Together, cap layer 340 and substrate 310 substantially surround filaments 330, 320.

Figure 3E:
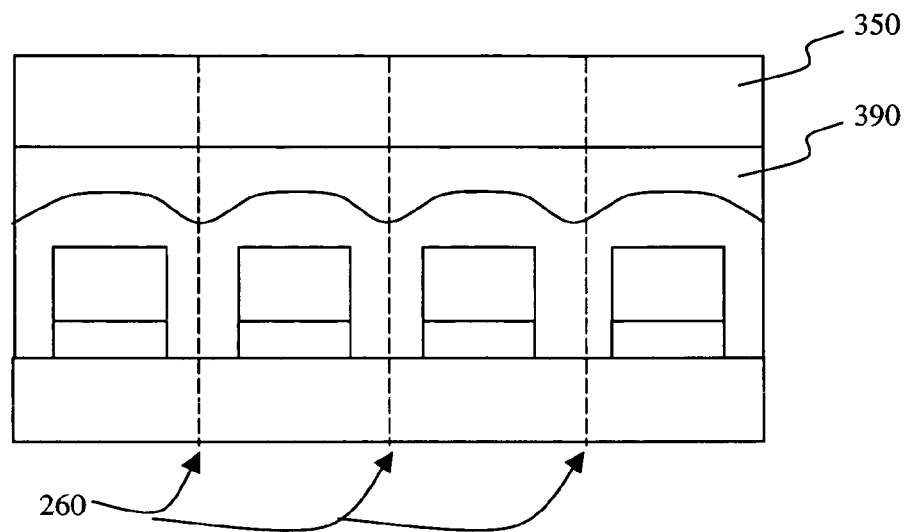

Next, as shown in FIG. 3E, filler 390 is used to optionally laminate stabilizer strip 350 to cap layer 340. Stabilizer strip 350 enhances the mechanical, thermal, and electrical stability of the wires at the end of the manufacturing process, as described in U.S. patent application Ser. No. 11/193,262. Filler 390 is typically electrically conductive and non-porous, e.g. solder or another low-melting temperature alloy or amalgam, a conductive polymer, or a pure metal such as In. An exemplary solder is Pb—Sn—Ag.

Optionally, a second cap layer is applied to the underside of the substrate, to which a second stabilizer strip can be laminated.

Figure 3F:
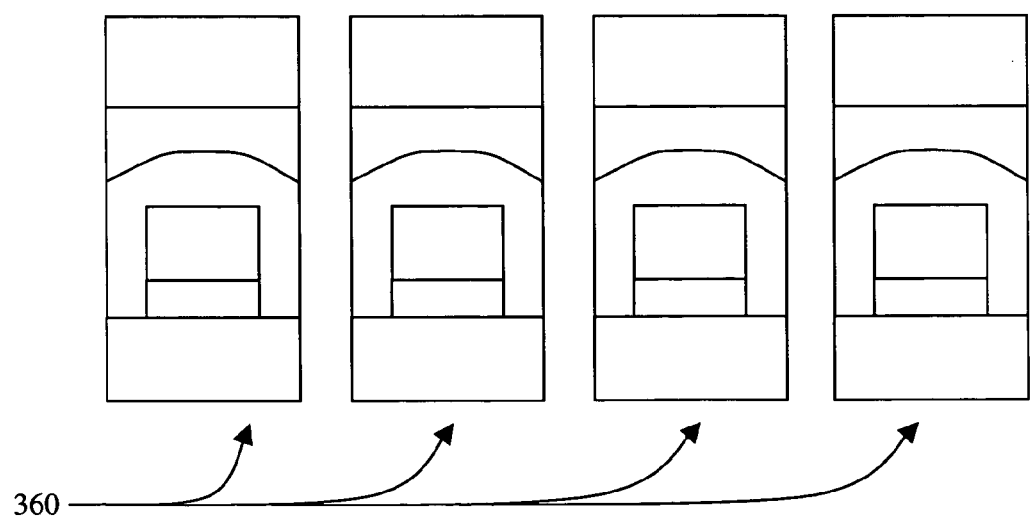

Next, as shown in FIG. 3F, assembly 310, 320, 330, 340, 350, 390 is slit to form multiple wires 360. Methods of slitting superconductor assemblies, according to certain embodiments, are described in greater detail below. Each wire 360 contains a superconductor layer 330 and one or more buffer layer(s) 320, and is substantially surrounded and sealed to the environment by bonding between substrate 310, cap layer 340. Stabilizer 350 and filler 390 further enhance the electrical, mechanical, and thermal integrity of wire 360, for example by providing an architecture that is resilient to stress and which improves current density in the wire, as described in U.S. Pat. No. 6,745,059. Slitting patterned assemblies that are sealed and stabilized, as described herein, avoids the need to individually seal and stabilize individual wires, allowing for the efficient fabrication of high quality wires.

Various steps in the manufacture of sealed, stabilized HTS wires will now be described in greater detail.

Patterning High Temperature Superconductors and Buffers

As discussed above, directly slitting brittle superconductor and buffer layers can crack and damage them. This can be avoided by instead using patterning to define regions where an assembly can be safely slit to form multiple wires, without needing to directly slit the brittle superconductor and buffer layers.

In some embodiments, only the superconductor layer is patterned, leaving buffer layer in the gaps between superconductor filaments, as shown in FIG. 3B. The cap layer and stabilizer are then coated over the assembly, as described above. Then, when the assembly is slit along the gaps to form multiple wires, the buffer layer is also slit within the gaps. However, any cracking of the buffer layer due to the slitting process may not negatively affect the performance of the wire. The cap layer and substrate may still bond together during the slitting process, despite the presence of the buffer within the gaps. This bonding may be enhanced by using a slitting method such as laser slitting, described below, which encourages fusion between the cap layer and substrate.

In one or more embodiments, the intermediate patterned film forms longitudinally arranged stripes having gaps between stripes. The stripes can be about 0.1 mm to 8 mm and the gaps between the stripes can have a width of about 0.1 to about 2 mm.

Although in the described embodiments, the assembly includes a single patterned superconductor layer, in general the assembly can have more than one superconductor layer, and even more than one substrate. For example, U.S. patent application Ser. No. 11/193,262, entitled "Architecture for High Temperature Superconducting Wire" describes HTS wires that include two assemblies, each assembly having a superconductor layer, a buffer layer, a cap layer, and a stabilizer strip, that are laminated together by their substrates to form a multi-substrate assembly. It is contemplated that patterning the superconductor layer for each assembly as described herein, e.g., as filaments, would allow for wide multi-substrate assemblies to be cost-effectively fabricated and then slit into multiple sealed wires. Each wire would then include two superconductor layers, which can provide enhanced current-carrying capability and performance. Multiple superconductor layers, or differently patterns for superconductor layers, such as curves, are also contemplated.

Methods of patterning superconductor and/or buffer layers, according to various embodiments of the invention, are described below.

A. Ink-Jet Printing

As described in U.S. patent application Ser. No. 10/955,866, entitled "Dropwise Deposition of a Patterned Oxide Superconductor," inkjet-type printing methods can be used to deposit an oxide superconductor precursor solution within defined regions, according to a desired pattern. The patterned layer is then converted into a patterned oxide superconductor. The method may be used to deposit virtually any pattern, for example multiple narrow filaments of oxide superconductor. Buffer materials may also be patterned using these methods, by an analogous process. For example, a soluble buffer precursor such as $La_2Zr_2O_5$ can be ink-jet printed onto the substrate, and then converted into an epitaxial film by thermally processing in an environment with a controlled pressure of $O_2$. The pressure of the $O_2$ is defined by the thermodynamic stability range of the oxide film and the metal substrate. The process can be repeated, e.g., with other buffer precursors, to produce a multi-layer buffer layer architecture.

In an exemplary method, precursor components to an oxide superconductor are dissolved in a suitable solvent to form a solution. Precursor components, and suitable solvents, are described in greater detail in U.S. patent application Ser. No. 10/955,866. The solution is introduced to a dispensing device that has at least one nozzle through which the solution may be discharged, continuously or intermittently on demand, in the form of discrete fine droplets. The dispensed precursor solution is deposited onto a textured target surface essentially point by point to form a thin film in a predetermined pattern. Thus, a high degree of precision can be realized.

During or after deposition, the deposited patterned precursor solution is dried to remove the solvent. The precursor components are converted into an oxide superconductor by treating the precursor film to form an intermediate film, and thereafter converting the intermediate film into an oxide superconductor.

A wide range of dispensing devices can be used to dispense the precursor solution. A dispensing device may include, for example, an inkjet print head (capable of, e.g., continuous and/or drop-on-demand printing), liquid droplet generator, extrusion device, gear pump, air pressure pump, positive displacement pump, screw-driven pump, syringe pump, fused deposition modeling nozzle or a combination thereof. These devices are well known in the art of liquid dispensing. The pattern, e.g., the gap between superconductor filaments, can be precisely controlled using computer control, as is known in the art.

Figure 4:
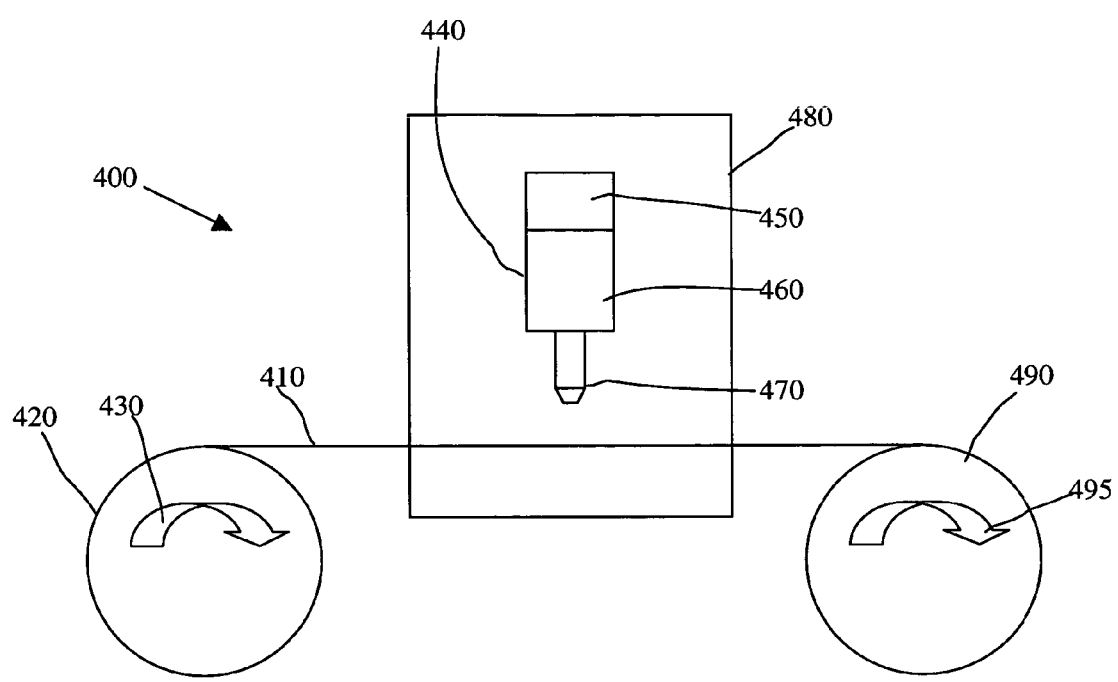
FIG. 4 shows a system used to deposit a patterned buffer or superconductor layer according to one or more embodiments of the invention.

FIG. 4 is a schematic illustration of a deposition system 400 that can be used to dropwise deposit a patterned superconductor layer on a substrate 410. The substrate 410 is typically provided as long lengths wound on a mandrel 420 or appropriate storage base. The mandrel is driven, as indicated by arrow 430, continuously or intermittently, to advance the substrate to various locations with the deposition system.

The substrate can be wound on a reel and transferred to a second reel such that during the transfer process that tape passes under the printer head. In one configuration, the printer head consist of multiple nozzles that extend across the width of the substrate that dispense the precursor in the desired pattern across the full width of the tape as it is moved under the printer head. In another configuration, the printer head consists of one or more nozzles that extend across a fraction of the substrate width. In this configuration, the printer head is moved across the substrate in a coordinated movement with linear substrate movement to generate the desired pattern across the full width and along the length of the substrate. In another configuration, the substrate is attached to a movable support that is moved under the printer head to generate the desired pattern.

The system also includes a dropwise dispensing device 440, such as an inkjet printhead. The dispensing device 440 includes a reservoir 450 where the precursor solutions are housed and a dispensing head 460 for generating droplets of the precursor solution. The dispensing head 460 further includes a nozzle or orifice 470 for ejecting droplets for deposition onto a receiving surface of the substrate. During the dispensing process, the substrate is moved past the dispensing head; the dispensing head may also be capable of movement. The receiving surface and dispensing head are moved (preferably under the direction of a computer and controller) (not shown) with respect to each other along selected directions in a predetermined pattern. The dispensing head may be designed to include a plurality of discharge orifices. Inkjet printheads containing several hundred to several thousand discharge orifices are commercially available. Alternatively, the dispensing device may include a plurality of dispensing heads, each having one or more discharge orifices. Use of multiple dispensing heads permits the use of different precursor solutions and deposition of different materials on the target substrate. An exemplary printhead provides ~22 µm×~5.3 µm sized dots and has a resolution of 1200× 1200 dpi and 4800×1200 dpi for conventional black and white and color printing, respectively.

The dispensing device may be contained within an enclosed environment 480, or it may be further equipped with fans or other means for controlling the vapor pressure above the deposited layer to assist in the drying of the precursor solution (not shown).

The substrate with the as-deposited precursor layer may then be taken-up by a take-up mandrel 490 (driven as indicated by arrow 495), where it is stored until subsequent processing into an oxide superconductor. Alternatively, the wire can be advanced into a heater (not shown) for conversion of the precursor components into an oxide superconductor.

The pattern printed by the device is selected to provide a region that may be safely slit without damaging the superconductor and buffer layers. To produce multiple wires from a wide tape patterned with superconductor filaments separated by gaps, as described above, the size of the gap may be selected to fit as many filaments of a desired size as possible across the substrate, while leaving a large enough gap to be able to slit the assembly without damaging the filaments. For example, the filaments may be between about 0.1 mm and 8 mm wide, and the gaps between the filaments may be between about 0.1 and 2 mm wide. Because dropwise deposition is a high-accuracy technique, a wide range of gap and filament widths, or any other desired patterns, can be selected according to the application of the HTS wires.

Although the methods are described with reference to a precursor solution to an oxide superconductor, it is also contemplated that the processing steps may be employed with a particle suspension or dispersion of oxide superconductor. These methods would provide complex oxide superconductor patterns such as the ones described herein prepared using solution deposition of precursor materials.

B. Patterned Slot Die Coating

Figure 5:
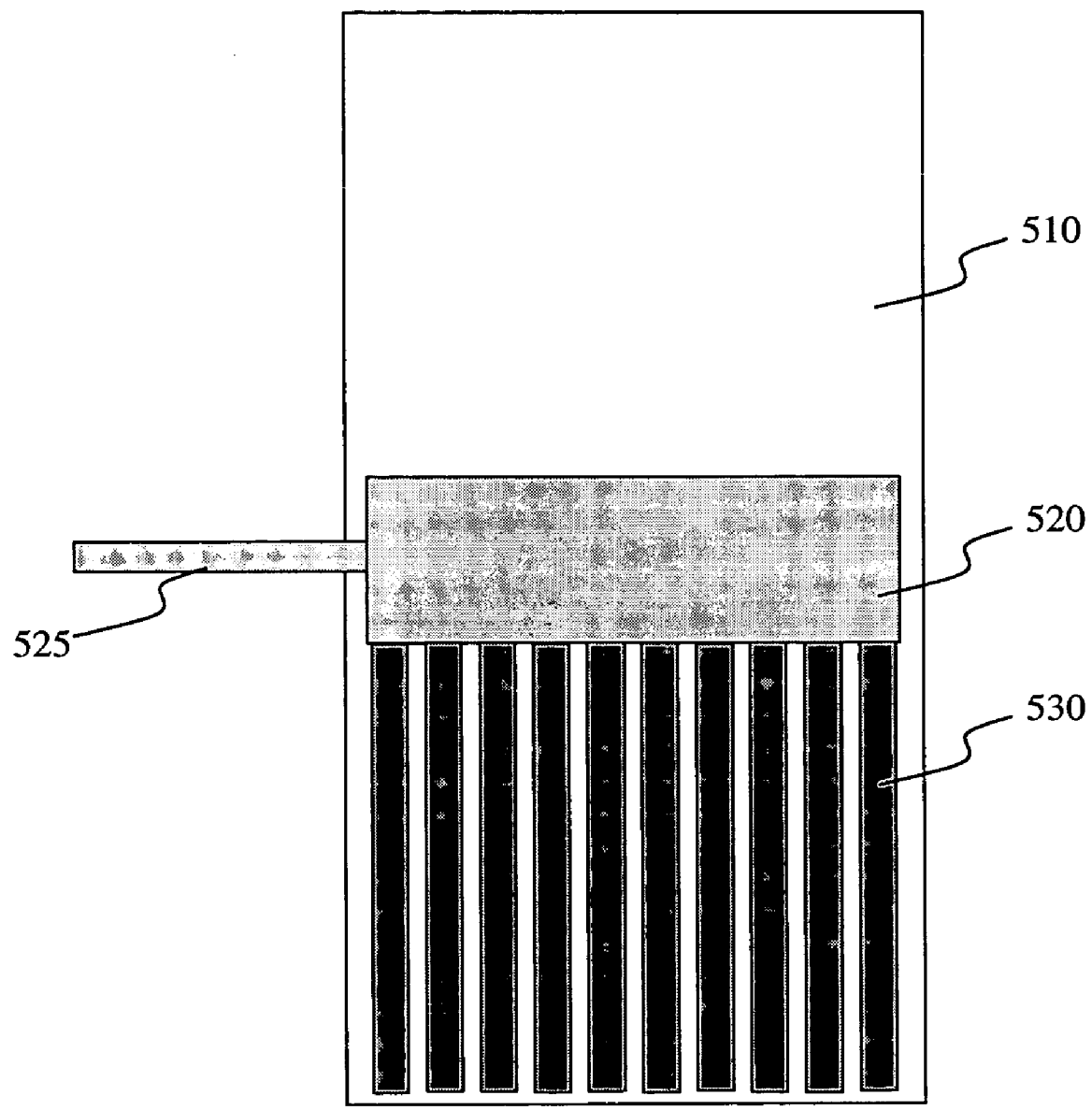
FIG. 5 is an illustration of a slot die coating technique according to one or more embodiments of the invention.

Superconductor layers can also be patterned during deposition using patterned slot die coating techniques, which are known in the art, and as are illustrated in FIG. 5. In this case, a superconductor precursor liquid from a liquid feed 525 is pushed into a slot die head 520, through a series of slots in the slot die head 520, and onto a moving substrate 510. Each slot produces a band of precursor 530 that is deposited onto the moving substrate 510 in a defined pattern. The resulting pattern on the substrate is a series of individual, parallel strips of precursor film with defined widths and spacings. The precursor film is dried to form filaments of precursor on the substrate. The patterned precursor film is then converted to a superconductor having substantially the same pattern. Buffer layers can be similarly patterned during deposition, if they have a liquid-based deposition step.

C. Photolithographic Patterning

Superconductor layers can also be patterned using photolithography techniques which are known in the art. In this case, a superconductor is deposited over the entire width of the substrate. A mask, consisting typically of an organic film, is deposited on select regions of the superconductor surface. The mask typically covers the regions of the superconductor that define the filaments. The area between the masked regions is then removed by chemical etching (e.g., an acid that dissolves the exposed superconductor). The mask is then removed. This process can be used to selectively remove only the superconductor layer between the masked regions. In other cases, the process can be adjusted to remove both the superconductor layer and buffer layers between the masked regions.

D. Laser Ablation

Laser ablation can be used to define a pattern in superconductor and/or buffer layers, using methods known in the art. A laser beam, which may be pulsed and which has a wavelength and power selected to ablate the desired layers, is used to irradiate the layers in accordance with a desired pattern. The pattern is controlled by computer to provide gaps for later slitting, e.g., between superconductor and buffer filaments. The power, duration of the laser pulse, repetition rate and speed of the laser can be varied to control the speed of the ablation and the amount of material ablated. This process can be used to selectively remove only the superconductor layer. In other cases, the process can be adjusted to remove both the superconductor layer and buffer layers.

Figure 6:
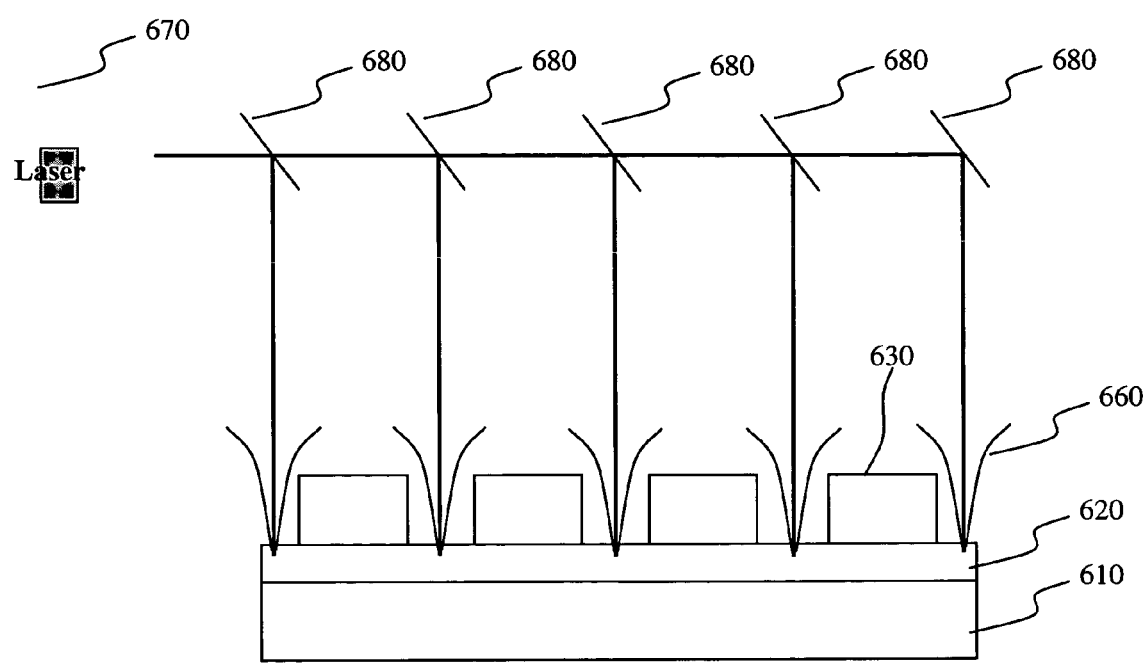
FIG. 6 shows a laser ablation system for patterning a buffer layer according to one or more embodiments of the invention.

The ablation method may be used to pattern some layers, and another method may be used to pattern other layers. For example, as illustrated in FIG. 6, laser ablation can be used to pattern only the buffer layer of an assembly, and other methods such as ink-jet printing or patterned slot-die coating can be used to pattern only the superconductor layer. This may be conveniently achieved by placing a laser ablation rig next to the ink-jet or slot-die coater, and maintaining computerized control of both processes. The assembly includes substrate 610, unpatterned buffer layer 620, and patterned filaments of superconductor 630. Laser 670 produces a single beam, which is split into multiple beams with beamsplitters 680. Direction and emission of the beams from the laser is controlled by computer (not shown). The laser beams irradiate assembly 610, 620, 630 in the gaps between filaments 630, selectively ablating buffer layer 620 in this region. This removes buffer 620, and any residual superconductor 630, from the gap, leaving a clean surface of substrate 610. The ablation process generates debris 660, which projects upwards from the assembly 610, 620, 630, and is removed by appropriate means. If necessary, the ablation step can be performed in an oxygen-free environment to avoid oxidizing the substrate.

Although the process is described regarding buffer layers, superconductor layers, superconductor precursor and intermediate layers can similarly be patterned using laser ablation techniques.

E. Scribing

As described in U.S. Provisional Patent Application No. 60/757,855, entitled "Method of Patterning Oxide Superconducting Films," one method of patterning a superconductor layer includes depositing a superconductor precursor layer over the entire width of the substrate, converting the precursor to a soft and ductile intermediate, and selectively removing portions of the intermediate to define a pattern. Then, the intermediate is converted to a superconductor layer, which retains substantially the same pattern as the intermediate.

In a metal organic (solution-based) deposition (MOD) process, precursor solutions containing suitable metal-containing precursors are decomposed to form an intermediate composition containing the constituent metals of the final oxide superconductor. In some instances, the intermediate composition includes metal oxides. In other instances where the precursor solution contains halides, and in particular fluoride, the intermediate composition includes a metal oxyhalide, e.g., a metal oxyfluoride. In a typical process, an MOD solution is deposited onto a substrate and decomposed to form an intermediate metaloxy (or metal oxyfluoride) film prior to formation of the oxide superconductor film. The decomposed metal oxy film is soft and ductile.

The intermediate metaloxy or metal oxyfluoride films may also be obtained using e-beam or pulsed e-beam deposition of oxygen and the constituent metal elements to an oxide superconductor. Electron beam deposition uses the heat generated by electron beams impacting the solid surfaces to evaporate yttrium, barium, and copper for physical vapor deposition (PVD) of YBCO thin films that have high-temperature superconducting properties. The three metals are evaporated by the electron beam guns while atomic oxygen is pumped in for oxidation of the elements. When a metal fluoride source is used as a target, a metal oxyfluoride intermediate film is deposited.

Methods of patterning these intermediate films take advantage of the less brittle nature of the decomposed precursor (as compared to the final oxide superconductor), and the intermediate metaloxy or metal oxyfluoride film is patterned by removing selected portions of the film at this stage of the process. Due to the less brittle nature of the film, the patterning process does not cause as much damage to the intermediate film as is observed for the oxide superconductor. Furthermore, any damage that does occur can be corrected during later processing of the intermediate film into an oxide superconductor.

The patterning process is selected to remove material from predetermined portions of the film. Exemplary materials removal processes include etching processes, such as mechanical removal, chemical etching, physical bombardment and plasma ion bombardment. The soft, malleable intermediate film is more readily removed using these techniques than is the brittle oxide superconductor. The patterning process also includes mechanically removing material from the intermediate film surface using an instrument capable of cutting, notching, or scoring the film.

Figure 7A:
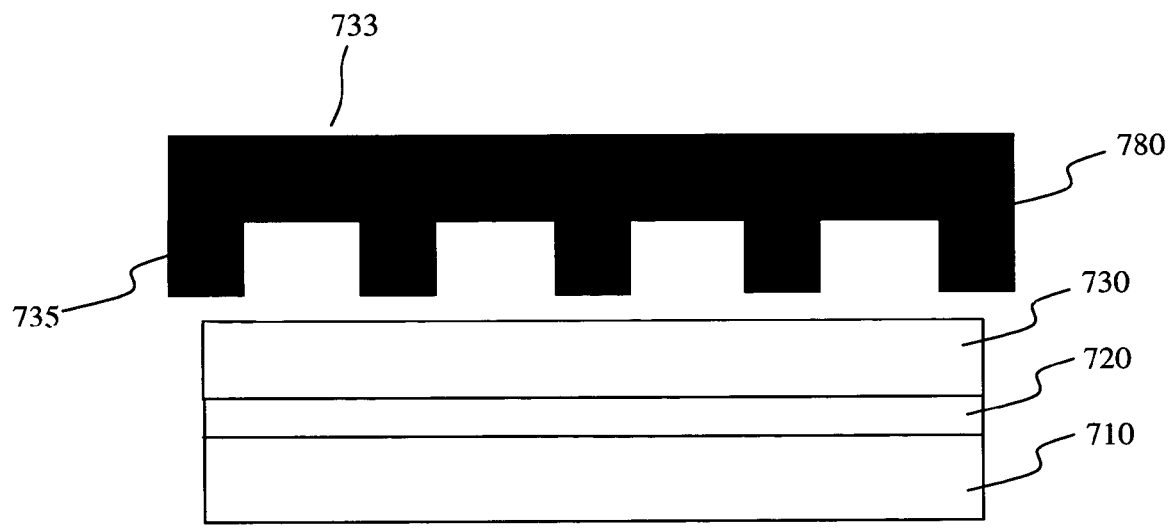
FIGS. 7A-7B show a process for patterning a superconductor intermediate layer according to one or more embodiments of the invention.
Figure 7B:
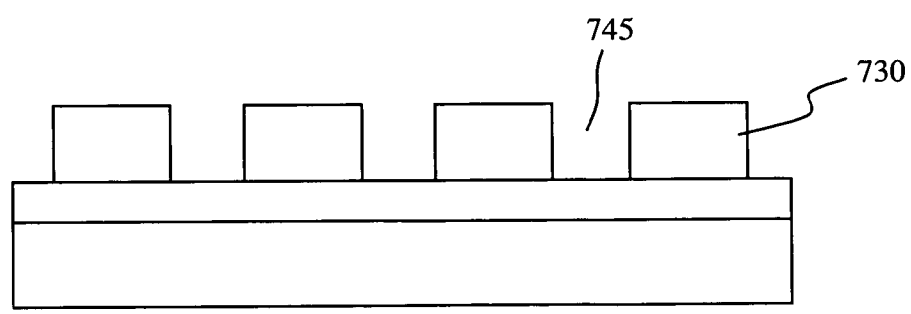

A mechanical patterning process is described with reference to FIGS. 7A-7B. FIG. 7A shows a simplified cross-section of an assembly including substrate 710, buffer layers 720, and an intermediate metaloxy or metaloxy fluoride layer 730. In one or more embodiments, the substrate 710 is at least about 4 cm wide, although wider substrates, e.g., 10 cm or higher, may be used. The metaloxy film layer 730 is obtained by appropriate heat treatment to decompose a previously deposited MOD precursor layer (described in greater detail below) or by e-beam deposition of a metaloxy or metal oxyfluoride film. The metaloxy film is considerably more malleable than the resultant oxide superconductor.

After the malleable intermediate layer 730 has been formed, the film is patterned by suitable means, for example, by mechanically removing material from the intermediate film surface using a scribing tool 780, as is illustrated in FIG. 7A. The scribing tool 780 includes a base 733 and a number of protrusions or scribing elements 735. The protrusions 735 are pressed into contact with the film surface to selectively remove portions of intermediate layer 730 as the scribing tool 780 is moved along layer 730 (or the layer moves beneath the scribing tool). The scribing tool can be connected to a computer-controlled X-Y stage and programmed to create a pattern of any choice (and of any length) including straight lines or other patterns, e.g., curves or diagonal patterns. The scribing step defines a pattern in intermediate film 730 by selectively removing regions of the film to form gaps 745, as illustrated in FIG. 7B. In general, the size and shape of the scribed-out regions of the superconductor layer are defined by the size and shape of scribing tool 780, and the motion with which it is applied to the precursor film. The carved-out material can be removed from the film surface before further processing, for example, by airflow over the film surface, rinsing in an inert solvent such as methanol or other conventional techniques. The patterned intermediate oxide film then is converted into a patterned oxide superconductor film by appropriate heat treatment.

Mechanical scribing of the intermediate layer can remove the entire intermediate layer under the scribe so as to expose the underlying buffer layers. It is appreciated that the scribe is controlled so as to avoid damaging buffer layer 720 or otherwise impairing the mechanical integrity or strength of the substrate, i.e., negatively affecting the performance of the wire. In other embodiments, a thin layer of the intermediate layer may remain after scribing; however, it is sufficiently thin that it does not impair subsequent slitting of the fully reacted superconductor film.

Depositing Cap Layers

In order to fabricate sealed wires from patterned superconductor and buffer filaments, the filaments are coated with a cap layer after patterning. Because the cap layer is in direct contact with the superconductor layer in the current embodiment, the cap layer should be inert to the superconductor material. The material for the cap layer is also selected such that it is nonporous. This renders the superconductor layer substantially impervious to contamination by environmental factors, which can degrade its electrical performance. The cap layer may also substantially prevent infiltration of the assemblies by surrounding cryogenic fluid, which can form balloons that can potentially mechanically damage the superconductor layer. Additionally, the cap layer provides an electrical pathway between the conductive layers in the assembly, e.g., the substrate, superconductor layer, filler, and/or stabilizer strip. This can be useful because it makes the entire outside of the HTS wire conductive, so that current can be easily introduced to the wire. Additionally, the cap layer also preferably "wets," or promotes adhesion to, filler material used in a later step to bond the assembly to a stabilizer strip.

The cap layer bonds to the substrate within the gaps between the filaments; the cap layer and substrate together substantially surround and seal the filaments from the environment, when the assembly is slit into wires. As discussed below, certain slitting methods can further enhance the seal between the cap layer and the substrate.

In some embodiments, the cap layer is a noble metal, such as silver or gold. Silver (Ag) can be deposited by a variety of methods including evaporation, solution deposition, sputtering, and other methods. Deposition of Ag by DC sputtering is a standard operation. Translating coated conductor tape thought the plasma in a continuous mode without degradation of the superconductor properties requires cooling of the tape as it passes through the plasma. The tape is pulled across a cooling block that is positioned opposite the target to minimize the maximum temperature of the tape during deposition to below ~200° C. Energy imparted from the plasma likely cleans the deposition surface in situ and deposits the Ag ions with enough impact energy to make good physical contact.

The cap layer can also be deposited by an electroplating process, by a metal powder sintering process, or by an electroless plating process, all of which are well known. Cu, Ag, Ti, TiN, and Sn are examples of metals that can be deposited onto superconductor and buffer filaments with these methods. Other materials, or combinations of materials, can also be used as the cap layer. Typically, Ag is used as a first interface on the HTS layer. Other materials can be added on top of the Ag.

Stabilizer Strip

To thermally, electrically, and mechanically stabilize the wires, a stabilizer strip can be laminated, with filler such as solder, to the cap layer prior to slitting. If done prior to slitting, the stabilizer strip can be considered part of the cap layer. The stabilizer strip adds thermal stability to the wire by providing additional heat capacity; adds electrical stability by providing another path for electric current in case of a damaged region of the superconductor layer; and adds mechanical stability by reducing stress to the superconductor layer if the wire is bent. The material used for the stabilizer strip is selected to provide an appropriate stability to the fabricated wires for the desired application. The stabilizer strip is generally a flexible conductive material, e.g. metal, such as aluminum, copper, silver, nickel, iron, stainless steel, aluminum alloy, copper alloy, silver alloy, nickel alloy, nickel tungsten alloy, or iron alloy. For most applications, a high conductivity metal such as copper is preferred. For a fault current limiter application, a mechanically strong, high resistivity alloy such as stainless steel is preferred. The thickness of the stabilizer strip can be varied throughout a wide range of about 0.01-2 mm, depending upon the desired application. For superconducting cables, the thickness is typically between 0.05-0.075 mm. For a fault current limiter application, the stabilizer thickness can range from 0.025 mm to above 1 mm.

Figure 8:
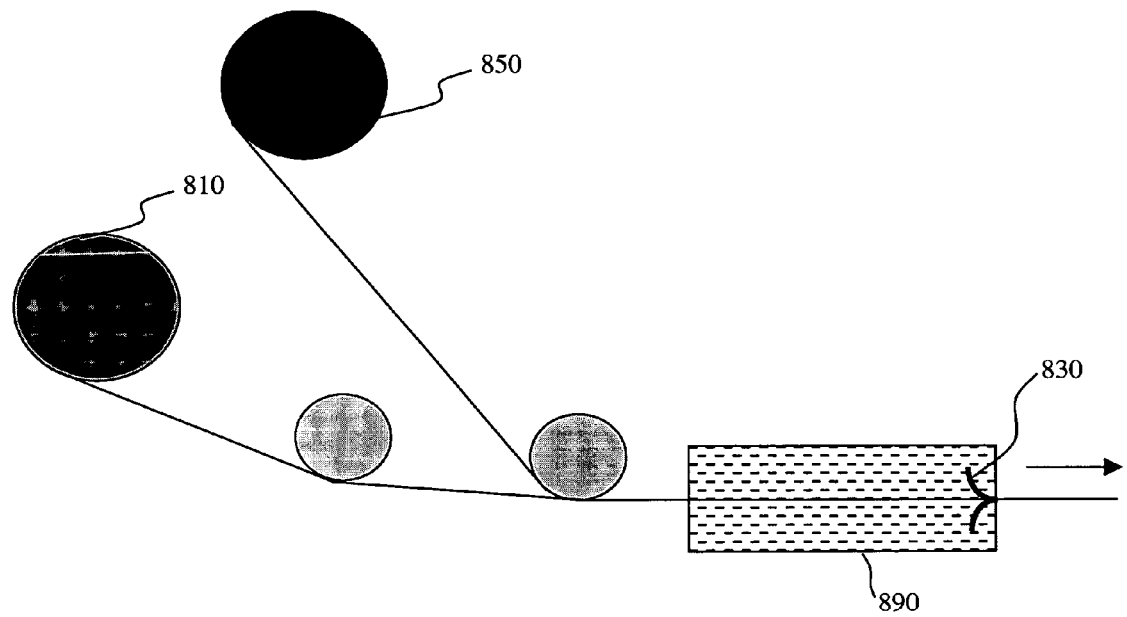
FIG. 8 shows a system for laminating a stabilizer strip to a superconductor assembly according to one or more embodiments of the invention.

The stabilizer strip can be laminated to the cap layer as illustrated in FIG. 8. Substrate 810, which includes patterned superconductor filaments and a cap layer, is joined with stabilizer 850 in a bath of filler 890. Substrate 810 may be fed into the filler bath from reels, and stabilizer strip 850 may be fed off of reels placed above the feed-in reels of substrate 810 so that the substrate and stabilizer form a stacked configuration, which is fed into filler bath 890 in the direction of the arrow. Die 830 presses substrate 810 to stabilizer strip 850, laminating the two together with filler 890, resulting in a structure as illustrated in FIG. 3E.

Slitting

After patterning the superconductor and buffer layers to form filaments separated by gaps, depositing a cap layer so that it bonds to the substrate within the gaps, and optionally laminating a stabilizer strip to the assembly, the assembly can be slit along the gaps to separate the assembly into multiple HTS wires. The slits are registered with the gaps, so as to avoid cracking the brittle oxide superconductor and buffer layers. During the slitting process, the cap layer and substrate may fuse together to enhance the seal around the resulting wire. Methods of slitting patterned superconductor assemblies, according to certain embodiments, are described below. In general, these methods can also be applied to other patterned superconductor assemblies, for example, to an assembly having patterned superconductor and buffer layers, but lacking a cap and/or stabilizer strip. In this case, the wires could be individually processed further after slitting, e.g., individually laminated.

In some embodiments, the buffer layer is unpatterned, and thus prevents direct contact within the gaps between the cap layer and the substrate. However, the buffer layer is relatively thin, and so may not significantly affect the cutting process.

Depending on the slitting process selected, the cap layer and substrate may still partially or substantially completely seal the wire by "wrapping around" the edge of the buffer layer that is exposed by the slit.

A. Mechanical Slitting

The assembly can be mechanically slit along the gaps between the filaments with a mechanical slitting tool. The tool can be a rotating knife or blade with a sharp edge that is smaller in width than the gap, so that the slitting takes place through the gap without disturbing the patterned superconductor and buffer layers. Typically, the slitting tool is a cutting wheel having a very narrow width, e.g., less than 0.2 mm. The slitting tool is equipped with precision guiding to provide the degree of precision needed to slit the strip within the gap. The slitting process provides wires of narrow dimension in accordance with the pattern of the filaments, e.g., 1-8 mm, or about 4 mm, as required for a particular application. Bonding between the cap layer and the substrate substantially surrounds and seals the wires. In general, the slitting tool can be used to slit an assembly in accordance with any desired pattern of the superconductor and/or buffer layers, which may or may not also include a cap layer and/or stabilizer strip. Slitting tools are known in the art.

B. Laser Slitting

Laser slitting can further improve the speed, efficiency, and cost of producing HTS wires, as well as the quality of the wires. Laser slitting offers a particularly "clean" method of slitting a patterned superconductor assembly, because it does not use moving parts and thus may avoid some complications of mechanical slitting devices, such as mechanical wear. For the superconductor assembly of FIG. 3D (without a stabilizer strip) only three laser beams are required.

If the superconductor assembly includes a stabilizer strip, then laser slitting has an additional benefit. Here, heat generated by the laser slitting process can fuse or weld the stabilizer strip to the substrate, hermetically sealing the wire as it is slit. Thus, the stabilizer strip and substrate are preferably made of a material that favors fusion in a welding process. For example, copper is preferable in many applications while stainless steel is preferable in a fault current limiter application. Other metals and alloys are also known to fuse in a welding process. Likewise, dissimilar but compatible metals in the stabilizer strip can also fuse.

In general, the superconductor assembly is irradiated with at least one laser beam in accordance with the defined pattern of the superconductor layer. Preferably, the laser beam is positioned so that it does not slit the superconductor layer itself, and also is far enough away to avoid thermally damaging the superconductor layer. The irradiation is controlled by computer. If there are multiple regions to be irradiated across the width of the assembly, e.g., multiple gaps as described above, the assembly can be irradiated by a single laser beam that is controlled to sequentially irradiate each gap. Alternately, multiple laser beams, either generated by multiple lasers or by splitting the output of a single laser into multiple beams, can be used to simultaneously irradiate the multiple gaps. This can simultaneously slit and seal multiple wires.

Figure 9:
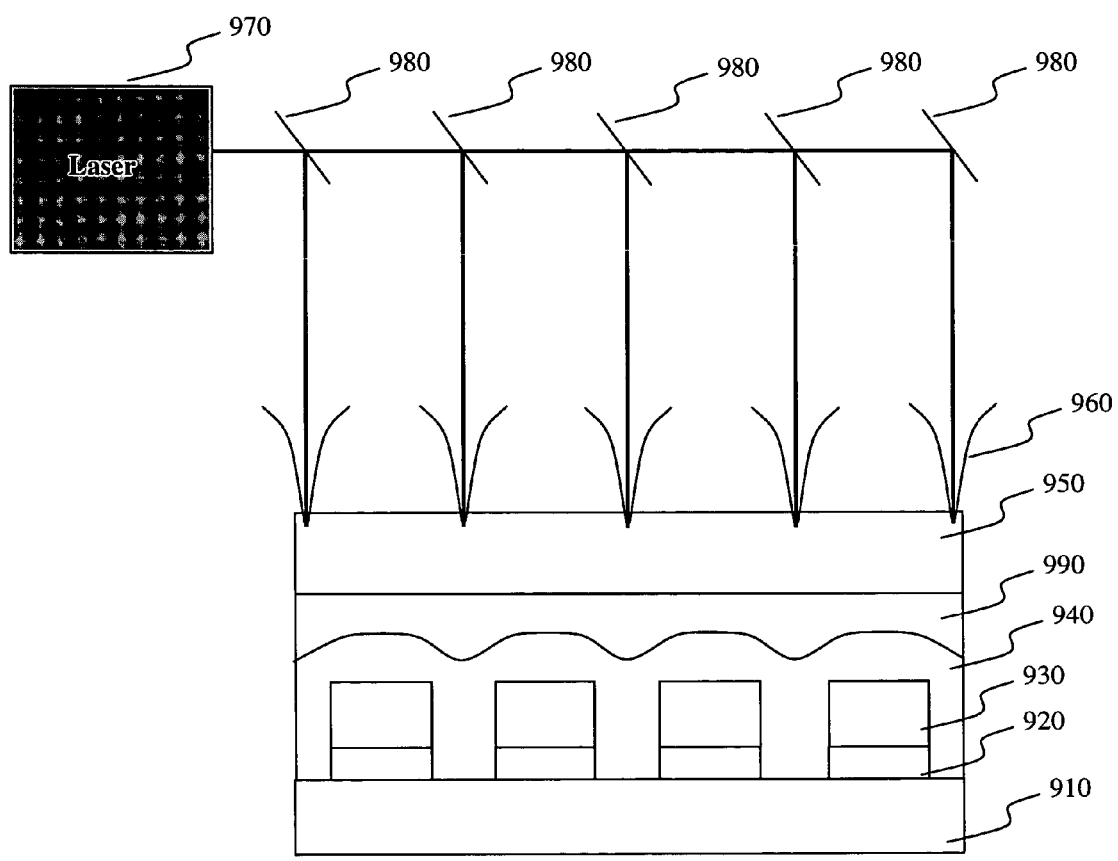
FIG. 9 shows a laser splicing system for forming sealed, stabilized HTS wires according to one or more embodiments of the invention.

For example, as illustrated in FIG. 9, multiple laser beams from a single laser are used to slit and an assembly having multiple superconducting filaments 930 into multiple sealed and stabilized wires. The superconducting assembly includes substrate 910, patterned buffer layer 920, patterned superconductor 930, cap layer 940, filler 990, and stabilizer strip 950. Laser 970 produces a single beam, which is split into multiple beams with beamsplitters 980. A computer (not shown) controls the direction and emission of the beams from the laser 970. The laser beams irradiate and slit through the entire superconducting assembly in regions that register with the gaps between the filaments of superconductor 930 and buffer 920. The slitting process generates debris 960, which projects upwards from the superconducting assembly.

The laser wavelength is selected to be compatible with the materials to be cut. For example, $CO_2$ lasers are known to cut stainless steel well, but not copper. The cutting process generates heat and debris, so a process to remove debris 960 can be included concurrently with the cutting process. Additionally, an environment such as a non-oxygen atmosphere can help to avoid laser-induced oxidation of one or more layers in the superconductor structure. The size of the gaps, the power and wavelength of the laser, and the speed of the assembly relative to the laser, are preferably adjusted so that heat from the laser does not damage the superconductor layer, and that other materials in the assembly, such as the buffer or any protective layers, are not damaged so as to detrimentally affect the performance of the resulting wires.

In some circumstances, laser slitting of superconductor assemblies can leave burrs on edges that have been cut by the laser beam. In this case, the burrs can be removed by mechanical methods such as sanding, chemical methods such as electro-polishing, or other suitable methods.

Fabricating HTS Wires

Figure 10:
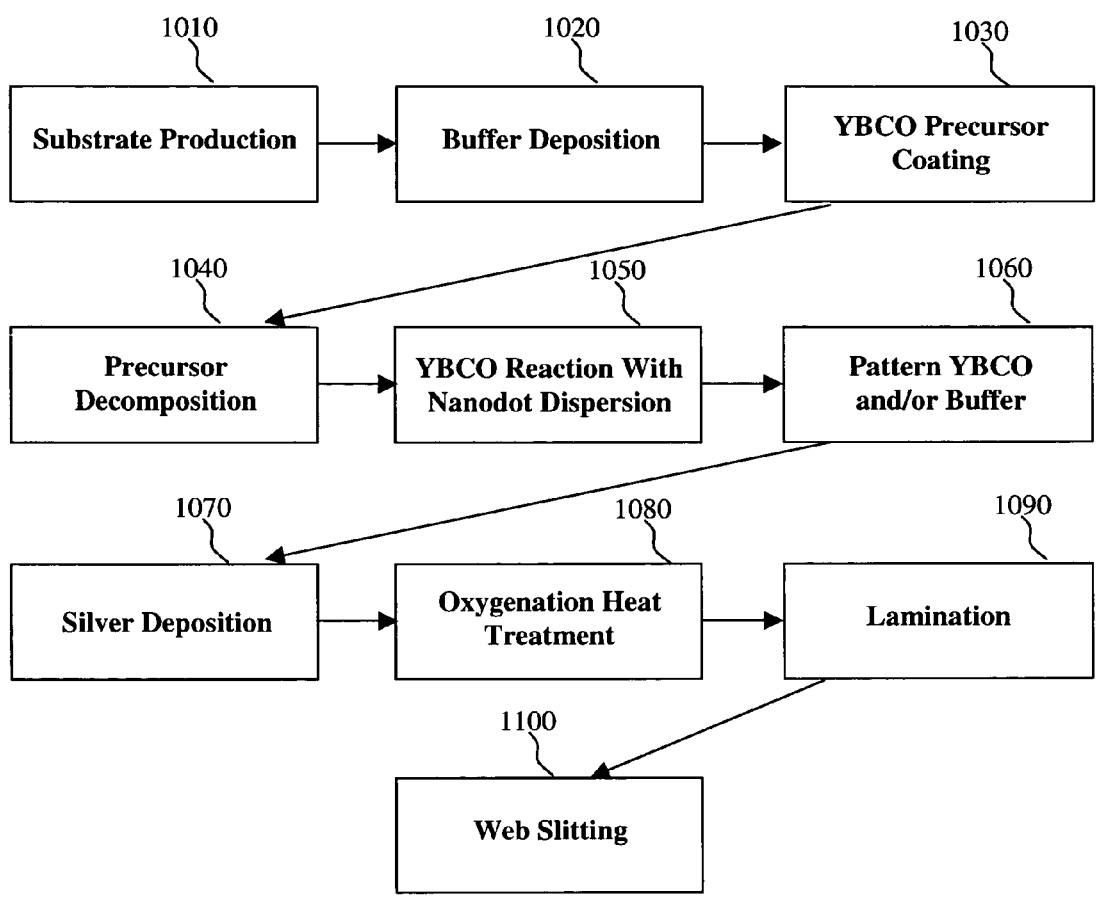
FIG. 10 is a schematic illustration of a system and process used to prepare an HTS wire according to one or more embodiments of the invention.

A web coating method of fabricating wires having the architecture $CeO_2/YSZ/Y_2O_3/NiW$ is shown in FIG. 10.

Textured Metal Substrate

The template is provided in widths of about 1 to 10 cm, or larger. Optionally, it is textured. A method of preparing a textured metal substrate suitable for use as a substrate for an HTS wire first is described. At a first station 1010, a substrate is treated to obtain biaxial texture. Preferably, the substrate surface has a relatively well-defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

The surface of the substrate can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quaternary alloy). In some of these embodiments, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g., annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g., Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the substrate in a surface treatment. The sulfur can be formed on the surface of the substrate, for example, by exposing the intermediate layer to a gas environment containing a source of sulfur (e.g., $H_2S$) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about $1 \times 10^{-3}$ torr, less than about $1 \times 10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., c(2×2)) can be formed by applying an appropriate organic solution to the surface of the intermediate layer by heating to an appropriate temperature in an appropriate gas environment. It can also be obtained by allowing sulfur, which can be added to the substrate material, to diffuse to the surface of the substrate.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

The substrate may also be untextured, for example, using Hastelloy or other commercial metals.

Buffer Layer

In a second processing station 1020, a buffer layer is formed on the textured substrate.

Examples of buffer materials include metals and metal oxides, such as silver, nickel, TbO, $CeO_2$, yttria-stabilized zirconia (YSZ), $Y_2O_3$, $Gd_2O_3$, $LaAlO_3$, $SrTiO_3$, $LaNiO_3$, $LaCuO_3$, $SrRuO_3$, $NdGaO_3$, $NdAlO_3$ and/or nitrides as known to those skilled in the art.

In certain embodiments, an epitaxial buffer layer can be formed using a low vacuum vapor deposition process (e.g., a process performed at a pressure of at least about $1\times10^3$ torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1\times10^{-3}$ torr, such as less than about $1\times10^{-4}$ torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1\times10^{-3}$ torr, at least about 0.1 torr, or at least about 1 torr) at a surface temperature below the temperature used to grow the epitaxial layer using physical vapor deposition at a high vacuum (e.g., at most about $1\times10^{-4}$ torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007,372 filed Jan. 15, 1998, and entitled "Low Vacuum Process for Producing Epitaxial Layers of Semiconductor Material," all of which are hereby incorporated by reference.

In some embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 eV are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate is made negative with respect to the anode potential, it will be subjected to a steady bombardment by ions from the gas prior to the deposition (if the target is shuttered) or during the entire film deposition. This ion bombardment can clean the substrate surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200° C. to 800° C., preferably 500° C. to 800° C., and more preferably, 650° C. to 800° C. Various well-known methods such as radiative heating, convection heating, and conduction heating are suitable for short (2 cm to 10 cm) lengths of substrate, but for longer (1 m to 100 m) lengths, these techniques may not be well suited. Also to obtain desired high throughput rates in a manufacturing process, the substrate must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes that contact the substrate in at least two different segments of the substrate. For example, if the substrate, in the form of a tape, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the substrate tape between current wheels.

In order that the deposition is carried out on a substrate that is at the appropriate temperature, the metal or oxide material that is deposited onto the substrate is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the substrate is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/615,669, filed on Jul. 14, 2000, and entitled "Oxide Layer Method," both of which are hereby incorporated by reference in their entirety.

In preferred embodiments, three buffer layers are used. A layer of $Y_2O_3$ or $CeO_2$ (e.g., from about 20 nanometers to about 75 nanometers thick) is deposited (e.g., using electron beam evaporation) onto the substrate surface. A layer of YSZ (e.g., from about 0.20 nanometers about 700 nanometers thick, such as about 75 nanometers thick) is deposited onto the surface of the $Y_2O_3$ or $CeO_2$ layer using sputtering (e.g., using magnetron sputtering). A $CeO_2$ layer (e.g., about 20 nanometers thick) is deposited (e.g., using magnetron sputtering) onto the YSZ surface. The surface of one or more of these layers can be chemically and/or thermally conditioned as described herein.

In certain embodiments, a buffer layer material can be prepared using solution phase techniques, including metalorganic deposition, which are known to those skilled in the art. Such techniques are disclosed in, for example, S. S. Shoup et al., J. Am. Cer. Soc., Vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

In certain embodiments, the buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

The formation of oxide buffer layers can be carried out so as to promote wetting of an underlying substrate layer. Additionally, in particular embodiments, the formation of metal oxide layers can be carried out using metal alkoxide or carboxylate precursors (for example, "sol gel" precursors).

As described above, if desired, the buffer layer or layers can be patterned either during or subsequent to their deposition.

Precursor Layer

Once the textured substrate including buffer layers is prepared, a precursor solution is deposited at a station 1030 as described above. One or more layers are deposited to form a precursor layer having the desired thickness and overall composition.

Suitable precursor components include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. At least one of the compounds is a fluorine-containing compound, such as the trifluoroacetate.

Examples of metal salt solutions that can be used are as follows.

In some embodiments, the metal salt solution can have a relatively small amount of free acid. In aqueous solutions, this can correspond to a metal salt solution with a relatively neutral pH (e.g., neither strongly acidic nor strongly basic). The metal salt solution can be used to prepare multi-layer superconductors using a wide variety of materials that can be used as the underlying layer on which the superconductor layer is formed.

The total free acid concentration of the metal salt solution can be less than about $1 \times 10^{-3}$ molar (e.g., less than about $1 \times 10^{-5}$ molar or about $1 \times 10^{-7}$ molar). Examples of free acids that can be contained in a metal salt solution include trifluoroacetic acid, acetic acid, nitric acid, sulfuric acid, acids of iodides, acids of bromides and acids of sulfates.

When the metal salt solution contains water, the precursor composition can have a pH of at least about 3 (e.g., at least about 5 or about 7).

In some embodiments, the metal salt solution can have a relatively low water content (e.g., less than about 50 volume percent water, less than about 35 volume percent water, less than about 25 volume percent water).

In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). The rare earth elements may be selected from the group of yttrium, cerium, neodymium, samarium, europium, gadolinium, terbium, dysprosium, holmium, erbium, thulium, ytterbium, and lutetium. Typically, the alkaline earth metal is barium, strontium or calcium. Such salts can have, for example, the formula $M(O_2C-(CH_2)_n-CXX'X'')(O_2C-(CH_2)_m-CX'''X''''X''''')(O_2C-(CH_2)_p-CX''''''X'''''''X'''''''')$ or $M(OR)_3$. M is the rare earth metal. n, m and p are each at least one but less than a number that renders the salt insoluble in the solvent(s) (e.g., from one to ten). Each of X, X', X'', X''', X'''', X''''', X'''''', X''''''' and X'''''''' is H, F, Cl, Br or I. R is a carbon containing group, which can be halogenated (e.g., $CH_2CF_3$) or nonhalogenated. Examples of such salts include nonhalogenated carboxylates, halogenated acetates (e.g., trifluoroacetate, trichloroacetate, tribromoacetate, triiodoacetate), halogenated alkoxides, and nonhalogenated alkoxides. Examples of such nonhalogenated carboxylates include nonhalogenated actetates (e.g., $M(O_2C-CH_3)_3$). Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Such salts can have, for example, the formula $M'(O_2C-(CH_2)_n-CXX'X'')(O_2C-(CH_2)_m-CX'''X''''X''''')$ or $M'(OR)_2$. M' is the alkaline earth metal. n and m are each at least one but less than a number that renders the salt insoluble in the solvent(s) (e.g., from one to ten). Each of X, X', x'', X''', X'''' and X''''' is H, F, Cl, B or, I. R can be a halogenated or nonhalogenated carbon containing group. Examples of such salts include halogenated acetates (e.g., trifluoroacetate, trichloroacetate, tribromoacetate, triiodoacetate). Generally, the transition metal is copper. The transition metal salt should be soluble in the solvent(s) contained in the precursor solution. In one or more embodiments of the present invention, the rare earth and the alkaline earth elements can form a metal or mixed metal oxyfluoride in place of or in addition to a rare earth oxide and an alkaline earth fluoride.

Suitable copper precursor solutions contain a copper salt that is soluble at the appropriate concentration in the solvent(s). Such compounds include copper nitrates, carboxylates, alkoxides, halides, sulfates or trifluoroacetates. Preferably, during conversion of the precursor to the intermediate (e.g., metal oxyhalide), minimal cross-linking occurs between discrete transition metal molecules (e.g., copper molecules). Such transition metals salts can have, for example, the formula $M''(CXX'X''-CO(CH)_aCO-CX'''X''''X''''')(CX''''''X'''''''X''''''''-CO(CH)_bCO-CX'''''''''X''''''''''X''''''''''')$, $M''(O_2C-(CH_2)_n-CXX'X'')(O_2C-(CH_2)_m-CX'''X''''X''''')$ or $M''(OR)_2$. M'' is the transition metal. a and b are each at least one but less than a number that renders the salt insoluble in the solvent(s) (e.g., from one to five). Generally, n and m are each at least one but less than a number that renders the salt insoluble in the solvent(s) (e.g., from one to ten). Each of X, X', X'', X''', X'''', X''''', X'''''', X''''''', X'''''''', X''''''''', X'''''''''' is H, F, Cl, Br or I. R is a carbon containing group, which can be halogenated (e.g., $CH_2CF_3$) or nonhalogenated. These salts include, for example, nonhalogenated actetates (e.g., $M''(O_2C-CH_3)_2$), halogenated acetates, halogenated alkoxides, and nonhalogenated alkoxides. Examples of such salts include copper trichloroacetate, copper tribromoacetate, copper triiodoacetate, $Cu(CH_3COCHCOCF_3)_2$, $CU(OOCC_7H_{15})_2$, $Cu(CF_3COCHCOF_3)_2$, $Cu(CH_3COCHCOCH_3)_2$, $Cu(CH_3CH_2CO_2CHCOCH_3)_2$, $CuO(C_5H_6N)_2$ and $Cu_3O_3Ba_2(O-CH_2CF_3)_4$. A suitable compound is copper proprionate. An example of a nonhalogenated propionate salt of a transition metal is $Cu(O_2CC_2H_5)_2$. In some embodiments, the transition metal salt is a simple salt, such as copper sulfate, copper nitrate, copper iodide and/or copper oxylate. In some embodiments, n and/or m can have the value zero. In certain embodiments, a and/or b can have the value zero. An illustrative and nonlimiting list of Lewis bases includes nitrogen-containing compounds, such as ammonia and amines. Examples of amines include $CH_3CN$, $C_5H_5N$ and $R_1R_2R_3N$. Each of $R_1R_2R_3$ is independently H, an alkyl group (e.g., a straight chained alkyl group, a branched alkyl group, an aliphatic alkyl group, a non-aliphatic alkyl group and/or a substituted alkyl group) or the like. Without wishing to be bound by theory, it is believed that the presence of a Lewis base in the metal salt solution can reduce cross-linking of copper during intermediate formation. It is believed that this is achieved because a Lewis base can coordinate (e.g., selective coordinate) with copper ions, thereby reducing the ability of copper to cross-link.

While the precursor solution typically contains stoichiometric amounts of the component metal compounds, i.e., 3:2:1 Cu:Ba:RE, in some embodiments an excess of copper or a deficiency of barium is used. The ratio of the transition metal to the alkaline earth metal can be greater than 1.5, and the precursor solution can include at least about 5 mol % excess copper, or at least about 20 mol % excess copper.

In addition to precursor components for the formation of a rare-earth/alkaline-earth-metal/transition-metal oxide, the precursor solution may include additive components and/or dopant components for the formation of flux pinning sites is used in a solution-based method to obtain a superconducting film having pinning centers. The additive compound can be metal compounds, such as soluble compounds of rare earths, alkaline earths or transition metals, cerium, zirconium, silver, aluminum, or magnesium, that form metal oxide or metal in the oxide superconductor film. The precursor solution can provide a dopant metal that partially substitutes for a metal of the precursor component of the precursor solution. Generally, a dopant component can be any metal compound that is soluble in the solvent(s) contained in the precursor solution and that, when processed to form an oxide superconductor, provided a dopant metal that substitutes for an element of the oxide superconductor.

The solvent or combination of solvents used in the precursor solution can include any solvent or combination of solvents capable of dissolving the metal salts (e.g., metal carboxylate(s)). Such solvents include, for example, alcohols or acids, including methanol, ethanol, isopropanol and butanol, propionic acid or water.

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

The methods of disposing the superconducting composition on the underlying layer (e.g., on a surface of a substrate, such as a substrate having an alloy layer with one or more buffer layers disposed thereon) include spin coating, dip coating, slot coating, web coating and other techniques known in the art.

Decomposition of the Precursor Layer

At a subsequent station 1040, the precursor components are decomposed. The conversion of the precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

An intermediate oxyfluoride film is considered to be any film that is a precursor to a rare earth metal-alkaline earth metal-transition metal oxide superconductor (hereinafter "RE-123") film that is comprised of (1) a mixture of $BaF_2$, a rare earth oxide or fluoride and/or transition metal, transition metal oxide or transition metal fluoride, (2) a mixture of a compound comprised of a RE—Ba—O—F phase, a rare earth oxide or fluoride and/or transition metal oxide or fluoride, or (3) as a mixture of a compound comprised of a Ba—O—F phase, rare earth oxides or fluorides and/or transition metal oxide or fluoride. The intermediate film can then be further processed to form a RE-123 oxide superconductor film. The oxide superconductor film also indicates a small, but detectable, fluoride residue.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 torr to about 50 torr, more preferably at from about 5 torr to about 30 torr, and most preferably at from about 20 torr to about 30 torr. The partial pressure of oxygen in the nominal gas environment is maintained at from about 0.1 torr to about 760 torr and preferably at about 730-740 torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. In these embodiments, heating is then continued to a temperature of from about 220° C. to about 290° C. (e.g., about 220° C.) in a water vapor pressure of from about 5 torr to about 50 torr water vapor (e.g., from about 5 torr to about 30 torr water vapor, or from about 10 torr to about 25 torr water vapor). The nominal partial pressure of oxygen can be, for example, from about 0.1 torr to about 760 torr. This is followed by heating to about 400° C. at a rate of at least about 2° C. per minute (e.g., at least about 3° C. per minute, or at least about 5° C. per minute) in a water vapor pressure of from about 5 torr to about 50 torr water vapor (e.g., from about 5 torr to about 30 torr water vapor, or from about 10 torr to about 25 torr water vapor) to form barium fluoride. The nominal partial pressure of oxygen can be, for example, from about 0.1 torr to about 760 torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 torr, a predetermined partial pressure of water vapor (e.g. at least about 10 torr, at least about 15 torr, at most about 25 torr, at most about 20 torr, about 17 torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

Forming the Oxide Superconductor

The superconductor intermediate film can then be heated to form the desired superconductor layer at a further processing station 1050. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 torr to about 760 torr and is comprised of about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and includes about 0.1 torr to about 1 torr oxygen and about 0.05 torr to about 4 torr water vapor.

The film is then held at a temperature of about 700° C.-825° C., preferably at a temperature of about 740° C. to 800° C. and more preferably at a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 torr to about 760 torr and is comprised of about 0.09 torr to about 50 torr oxygen and about 0.01 torr to about 150 torr water vapor and about 0 torr to about 750 torr of an inert gas (nitrogen or argon). More preferably, the nominal gas environment has a total pressure of about 0.15 torr to about 5 torr and is comprised of about 0.1 torr to about 1 torr oxygen and about 0.05 torr to about 4 torr water vapor.

The film is then cooled to room temperature in a nominal gas environment with an oxygen pressure of about 0.05 torr to about 150 torr, preferably about 0.1 torr to about 0.5 torr and more preferably from about 0.1 torr to about 0.2 torr.

The resultant superconductor layer is well ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

The superconductor layer can also be deposited in-situ (no precursor deposition and separate reaction steps) by laser ablation, MOCVD, or other techniques known in the art.

Patterning

The YBCO layer, and optionally the buffer layer, are patterned at station 1060. As described in greater detail above, depending on the particular method or methods selected to pattern them, the layers can be patterned either after their formation, as illustrated in FIG. 10, or can be patterned during their deposition or while they are in an intermediate state.

Further Processing

Further processing by cap layer deposition at station 1070; oxygen anneal at station 1080, e.g., where the superconductor is fully oxygenated to form an orthorhombic superconducting YBCO phase, generally by heating the assembly in an oxygen atmosphere at temperatures of 500-600° C.; lamination to a stabilizer strip at station 1090; and slitting at station 1100 are carried out. By patterning the oxide superconductor film into filaments prior to cap layer deposition and stabilizer strip lamination, the assembly is slit into sealed, stabilized wires of a dimension that is useable in a current carrying application without damage to the brittle oxide superconductor film.

Incorporation by Reference

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces," U.S. Pat. No. 6,537,689, issued Mar. 25, 2003, and entitled "Multi-Layer Superconductor Having Buffer Layer With Oriented Termination Plane," PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefore," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Making Same," PCT Publication No. WO 2005/121414, published on Dec. 22, 2005, and entitled "Deposition of Buffer Layers on Textured Metal Surfaces," PCT Publication No. WO 2005/081710, published on Sep. 9, 2005, and entitled "Oxide Films with Nanodot Flux Pinning Sites," U.S. Pat. No. 6,436,317, issued on Aug. 20, 2002, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. Pat. No. 6,797,313, issued on Sep. 28, 2004, and entitled "Superconductor Methods and Reactor;" and U.S. Provisional Patent Application Ser. No. 60/308,957, filed on Jul. 31, 2001, and entitled "Superconductor Methods and Reactors;" and U.S. Provisional Patent Application Ser. No. 60/166,297, filed on Nov. 18, 1999, and entitled "Superconductor Articles and Compositions and Methods for Making Same," and commonly owned U.S. Pat. No. 6,974,501, issued on Dec. 13, 2005, and entitled "Superconductor Articles and Compositions and Methods for Making Same," commonly owned U.S. patent application Ser. No. 10/955,866, filed on Sep. 29, 2004, and entitled "Dropwise Deposition of a Patterned Oxide Superconductor," commonly owned U.S. patent application Ser. No. 11/241,636, filed on Sep. 30, 2005, and entitled "Thick Superconductor Films with Improved Performance," commonly owned U.S. patent application Ser. No. 10/955,875, filed on Sep. 29, 2004, and entitled "Low AC Loss Filamentary Coated Superconductors," commonly owned U.S. patent application Ser. No. 10/955,801, filed on Sep. 29, 2004, and entitled "Stacked Filamentary Coated Superconductors," commonly owned U.S. patent application Ser. No. 11/193,262, filed on Jul. 29, 2005, and entitled "Architecture for High Temperature Superconducting Wire," commonly owned U.S. Provisional patent application Ser. No. 60/667,001, filed on Mar. 31, 2005, and entitled "Mesh-Type Stabilizer for Filamentary Coated Superconductors," and commonly owned U.S. Provisional patent application Ser. No. 60/703,815, filed Jul. 29, 2005, and entitled "High Temperature Superconducting Wires and Coils," all of which are hereby incorporated by reference.

Other embodiments are within the following claims.

What is claimed is:

1. A method of making a laminated superconductor wire, the method comprising:
providing an assembly, comprising:
a substrate;
a superconductor layer overlaying a surface of the substrate, said superconductor layer having a defined pattern, wherein the defined pattern comprises regions free from superconductor material; and
a cap layer;
slitting through the thickness of the assembly in the region free from superconductor material to form a sealed wire.

2. The method of claim 1, wherein slitting through the thickness of the assembly in the region free from superconductor material forms multiple sealed wires.

3. The method of claim 2, wherein the substrate is substantially wider than the sealed wires.

4. The method of claim 1, wherein the defined pattern of the superconductor layer comprises multiple filaments separated by multiple gaps along the length of the substrate.

5. The method of claim 4, wherein each of the multiple filaments has a width between about 0.1 mm and 8 mm.

6. The method of claim 4, wherein each of the multiple gaps has a width between about 0.1 and 2 mm.

7. The method of claim 1, wherein the cap layer contacts the substrate in accordance with the defined pattern of the superconductor layer.

8. The method of claim 7, wherein the sealing of the wire derives from bonding between the cap layer and the substrate.

9. The method of claim 8, wherein slitting though the thickness of the assembly enhances bonding between the cap layer and the substrate.

10. The method of claim 1, wherein providing the assembly comprises using ink-jet printing to provide the superconductor layer in accordance with the defined pattern.

11. The method of claim 1, wherein providing the assembly comprises using patterned slot-die coating to provide the superconductor layer in accordance with the defined pattern.

12. The method of claim 1, wherein providing the assembly comprises using photolithographic patterning to provide the superconductor layer in accordance with the defined pattern.

13. The method of claim 1, wherein providing the assembly comprises depositing a superconductor precursor, patterning the precursor using laser ablation in accordance with the defined pattern, and converting the precursor to the superconductor layer.

14. The method of claim 1, wherein providing the assembly comprises depositing a superconductor precursor, patterning the precursor using mechanical scribing in accordance with the defined pattern, and converting the precursor to the superconductor layer.

15. The method of claim 1, wherein the assembly further comprises a buffer layer between the substrate and the superconductor layer.

16. The method of claim 15, wherein providing the assembly comprises patterning the buffer layer in accordance with the defined pattern of the superconductor layer.

17. The method of claim 16, comprising patterning the buffer layer after providing the superconductor layer.

18. The method of claim 16, comprising patterning the buffer layer before providing the superconductor layer.

19. The method of claim 1, wherein slitting through the thickness of the assembly comprises mechanically cutting the assembly.

20. The method of claim 1, wherein slitting through the thickness of the assembly comprises irradiating the assembly with at least one laser beam.

21. The method of claim 20, wherein irradiating the assembly with at least one laser beam welds the cap layer to the substrate.

* * * * *